(12) United States Patent
Ackerman et al.

(10) Patent No.: US 9,350,384 B2
(45) Date of Patent: May 24, 2016

(54) HIERARCHICAL DATA COMPRESSION AND COMPUTATION

(71) Applicant: International Business Machines Corporation, Armonk, NY (US)

(72) Inventors: William B. Ackerman, North Billerica, MA (US); Garth A. Dickie, Framingham, MA (US); Jeffrey M. Keller, Cambridge, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/501,790

(22) Filed: Sep. 30, 2014

(65) Prior Publication Data

US 2016/0094242 A1 Mar. 31, 2016

(51) Int. Cl.
*H03M 7/34* (2006.01)
*H03M 7/30* (2006.01)
*H03M 7/46* (2006.01)

(52) U.S. Cl.
CPC .............. *H03M 7/6035* (2013.01); *H03M 7/46* (2013.01)

(58) Field of Classification Search
CPC ............................... H03M 7/6035; H03M 7/46
USPC ................................................. 341/50–51, 87
See application file for complete search history.

(56) References Cited

U.S. PATENT DOCUMENTS

| | | | |
|---|---|---|---|
| 5,467,087 A * | 11/1995 | Chu ..................... | H03M 7/3086 341/51 |
| 5,603,022 A | 2/1997 | Ng et al. | |
| 5,729,228 A | 3/1998 | Franaszek | |
| 5,964,842 A * | 10/1999 | Packard .................... | G06F 3/14 348/394.1 |
| 6,195,024 B1 | 2/2001 | Fallon | |

(Continued)

FOREIGN PATENT DOCUMENTS

| | | |
|---|---|---|
| CN | 101711001 A | 5/2010 |
| EP | 2387004 A1 | 11/2011 |

(Continued)

OTHER PUBLICATIONS

Baek, Seung Jun, et al.; "Minimizing energy consumption in large-scale sensor networks through distributed data compression and hierarchical aggregation." Selected Areas in Communications, IEEE Journal on 22, No. 6 (2004), 10 pages.

(Continued)

*Primary Examiner* — Khai M Nguyen
(74) *Attorney, Agent, or Firm* — Prentiss Johnson; Edell, Shapiro & Finnan, LLC

(57) ABSTRACT

According to embodiments of the present invention, machines, systems, methods and computer program products for hierarchical compression of data are presented comprising creating a compression hierarchy of compression nodes, wherein each compression node is associated with a compression operation to produce compressed data. An output of any of the compression nodes may be compressed by another compression node or the same compression node. A path of one or more compression nodes is determined through said compression hierarchy based upon compression statistics to compress data, and the data is compressed by the compression nodes of the path. Various computational techniques are presented herein for manipulating the compression hierarchy to defer or reduce computation during query evaluation.

11 Claims, 13 Drawing Sheets

(56) References Cited

U.S. PATENT DOCUMENTS

| | | | |
|---|---|---|---|
| 6,253,222 B1 | 6/2001 | Dyer | |
| 6,373,986 B1 | 4/2002 | Fink | |
| 6,396,420 B1 | 5/2002 | Augustine | |
| 6,462,680 B1 | 10/2002 | Hayes | |
| 6,577,254 B2* | 6/2003 | Rasmussen | G06T 9/00 341/51 |
| 6,624,761 B2* | 9/2003 | Fallon | G06T 9/00 341/51 |
| 6,885,319 B2* | 4/2005 | Geiger | H03M 7/30 341/51 |
| 7,024,414 B2 | 4/2006 | Sah et al. | |
| 7,139,765 B1 | 11/2006 | Balkany et al. | |
| 7,453,377 B2 | 11/2008 | Lee et al. | |
| 7,529,752 B2 | 5/2009 | Hinshaw et al. | |
| 7,612,694 B1 | 11/2009 | Schneider | |
| 7,652,596 B1 | 1/2010 | Sharma | |
| 8,108,355 B2 | 1/2012 | Zhang | |
| 8,108,361 B2 | 1/2012 | Netz | |
| 8,126,855 B2 | 2/2012 | Faerber et al. | |
| 2001/0031092 A1* | 10/2001 | Zeck | H04N 1/41 382/239 |
| 2001/0051941 A1 | 12/2001 | Tonomura | |
| 2002/0090141 A1 | 7/2002 | Kenyon et al. | |
| 2007/0257824 A1 | 11/2007 | Harada et al. | |
| 2008/0071818 A1 | 3/2008 | Apanowicz | |
| 2008/0189251 A1 | 8/2008 | Branscome et al. | |
| 2010/0153064 A1 | 6/2010 | Cormode et al. | |
| 2010/0281079 A1 | 11/2010 | Marwah et al. | |
| 2011/0099295 A1 | 4/2011 | Wegener | |
| 2012/0016901 A1 | 1/2012 | Agarwal et al. | |
| 2012/0054225 A1 | 3/2012 | Marwah et al. | |
| 2012/0089579 A1 | 4/2012 | Ranade et al. | |
| 2013/0018889 A1 | 1/2013 | Jagmohan et al. | |
| 2013/0086353 A1 | 4/2013 | Colgrove et al. | |
| 2013/0099946 A1 | 4/2013 | Dickie et al. | |
| 2013/0124467 A1 | 5/2013 | Naidu et al. | |
| 2015/0188563 A1 | 7/2015 | Dickie | |
| 2015/0188564 A1 | 7/2015 | Dickie | |
| 2015/0286465 A1 | 10/2015 | Dickie | |
| 2015/0288381 A1 | 10/2015 | Dickie | |

FOREIGN PATENT DOCUMENTS

| | | |
|---|---|---|
| KR | 1020110053737 A | 5/2011 |
| WO | 2008034213 | 3/2008 |
| WO | 2009058650 | 5/2009 |
| WO | 2013096620 | 6/2013 |

OTHER PUBLICATIONS

Yang, Dow-Yung, et al; "Compression of particle data from hierarchical approximate methods." ACM Transactions on Mathematical Software (TOMS) 27, No. 3 (2001): 317-339.

Wikepedia, "Charles Joseph Minard", Sep. 26, 2014, 4 pages.

Friedman, "Data Visualization: Modern Approaches", Smashing Magazine, Aug. 2, 2007, 29 pages.

Wiegand, "Google Analytics Flow Analysis—Early Insights", Analytics Review, Jan. 15, 2013, 6 pages.

IBM, "Information as service from Server Explorer in Microsoft Visual Studio .Net", IP.com, IPCOM000139374D, Aug. 22, 2006, 5 pages.

Raman et al., "DB2 with BLU Acceleration: So Much More than Just a Column Store", Proceedings of the VLDB Endowment, vol. 6, No. 11, Copyright 2013, VLDB Endowment 2150-8097/13/09, 12 pages.

List of IBM Patents or Patent Applications Treated as Related, May 1, 2015.

Internet Society et al.; "A Negative Acknowledgment Mechanism for Signaling Compression"; An IP.com Prior Art Database Technical Disclosure; http://ip.com/IPCOM/000125196D; May 24, 2005.

Tagliasacchi, M. et al.; "Transform coder identification based on quantization footprints and lattice theory"; Department of Electronics and Information, Milano College, Milano Italy; Nov. 19, 2012.

Euclid, "Elements," Books 7 and 10, c. 300 BC; http://aleph0.clarku.edu/~djoyce/java/elements/toc.html.

Justin Zobel and Alistair Moffat, "Inverted Files for Text Search Engines". ACM Computing Surveys, vol. 38, No. 2, Article 6 (Jul. 2006). DOI=10.1145/1132956.1132959 http://doi.acm.org/10.1145/1132956.1132959.

Jordi Nin, Anne Laurent, and Pascal Poncelet, "Speed up gradual rule mining from stream data! A B-Tree and OWA-based approach". J. Intell. Inf. Syst. 35, 3 (Dec. 2010), pp. 447-463. DOI=10.1007/s10844-009-0112-9 http://dx.doi.org/10.1007/s10844-009-0112-9.

J. M. Chambers, "Algorithm 410: Partial Sorting [M1]", CACM, vol. 14, Issue 5, May 1971, pp. 357-358.

William Pugh, "A Skip List Cookbook", UMIACS—TR-89-72.1, Jul. 1989, pp. 2-14.

List of IBM Patents or Patent Applications Treated As Related, May 11, 2015.

"Capture and display of performance profile for dataflow graph", IPCOM000232481D, Nov. 11, 2013, 4 pages.

Microsoft, "Block-Based Floating Point Texture Compression", An IP.com Prior Art Database Technical Disclosure, http://ip.com/IPCOM/000167464D, Feb. 14, 2008. 9 pages.

IBM, "Practical Two-Cycle Forwarding Mechanism for Floating Point Units", An IP.com Prior Art Database Technical Disclosure, http://ip.com/IPCOM/000116162D, IBM Technical Disclosure Bulletin, vol. 38, No. 08, Aug. 1995, pp. 225-236.

Pool et al., "Lossless Compression of Variable-Precision Floating-Point Buffers on GPUs", ACM, copyright 2011, pp. 1-8.

Isenburg et al., "Lossless Compression of Floating-Point Geometry", copyright CAD Solutions Co., Ltd., CAD'04 Conference, 2004, pp. 1-7.

Steele Jr. et al., "How to Print Floating-Point Numbers Accurately", Proceedings of the ACM SIGPLAN'90 Conference, White Plains, NY, Jun. 1990, ACM 0-89791-364-7/90/0006/0112, pp. 112-126.

Loitsch, Florian, "Printing Floating-Point Numbers Quickly and Accurately with Integers", PLDI'10, Toronto, Ontario, Canada, Jun. 2010, ACM 978-1-4503-0019/10/06, 11 pagers.

Isenburg et al., "Lossless Compression of Predicted Floating-Point Values", http://www.cs.unc.edu/~isenburg/lcpfpv/, accessed May 2013, 2 pages.

Isenburg et al., "Lossless Compression of Predicted Floating-Point Geometry", Jul. 10, 2004, pp. 1-13.

Lindstrom et al., "Fast and Efficient Compression of Floating-Point Data", IEEE Transactions on Visualization and Computer Graphics, vol. 12, No. 5, Sep./Oct. 2006, 6 pages.

List of IBM Patents or Patent Applications Treated As Related, Jun. 12, 2015.

Wolfram MathWorld, "Fundamental Theorem of Arithmetic", 2012, retrieved from https://web.archive.org/web/20120704180459/http://mathworld.wolfram.com/FundamentalTheoremofArithmetic.html.

Wikipedia.org, "Fundamental theorem of arithmetic", 2013, retrieved from https://en.wikipedia.org/w/index.php?title=Fundamental_theorem_of_arithmetic &oldid=574451066.

List of IBM Patents or Patent Applications Treated As Related, Feb. 4, 2016, 1 page.

\* cited by examiner

HIERARCHICAL DATA COMPRESSION AND COMPUTATION

BACKGROUND

Present invention embodiments relate to compression and storage of data, and more specifically, to composing compression nodes to achieve hierarchical compression of data and manipulating the compression hierarchy to defer or reduce computation during query evaluation.

Good compression ratios are needed in order to maximize capacity of storage and caches as well as reduce the amount of data traffic (e.g., input/output (I/O)) during query evaluations on storage and data networks. Existing compression schemes generally require full decompression (either to a buffer or streaming) before the data may be operated on as part of the query evaluation. Central processing unit (CPU) time and memory bandwidth required for such decompression may be large and costly from a computational perspective.

Other existing techniques, relative to existing compression schemes, allow fast single instruction, multiple data (SIMD) operations on compressed values, without first decompressing the data. Such techniques offer a significant improvement on computational load, however, the effect is limited since the remaining computation is still linearly related to the amount of data, e.g., the number of data values, because the number of calculations performed increases proportionately to the number of values.

SUMMARY

According to embodiments of the present invention, machines, systems, methods and computer program products for hierarchical compression of data are presented comprising creating a compression hierarchy of compression nodes, wherein each compression node is associated with a compression operation to produce compressed data. An output of any of the compression nodes may be compressed by another compression node or the same compression node. A path of one or more compression nodes is determined through said compression hierarchy to compress data based upon compression statistics, and the data is compressed by the compression nodes of the path.

These and other aspects, features and embodiments of the present invention will be understood with reference to the drawing figures and the detailed description herein, and will be realized by way of the various elements and combinations particularly pointed out in the appended claims. It is to be understood that both the foregoing general description and the following brief description of the drawings and detailed description are examples and explanatory of preferred embodiments of the invention, and are not restrictive of present invention embodiments, as claimed.

BRIEF DESCRIPTION OF THE SEVERAL VIEWS OF THE DRAWINGS

Generally, like reference numerals in the various figures are utilized to designate like components.

DETAILED DESCRIPTION

Figure 1:
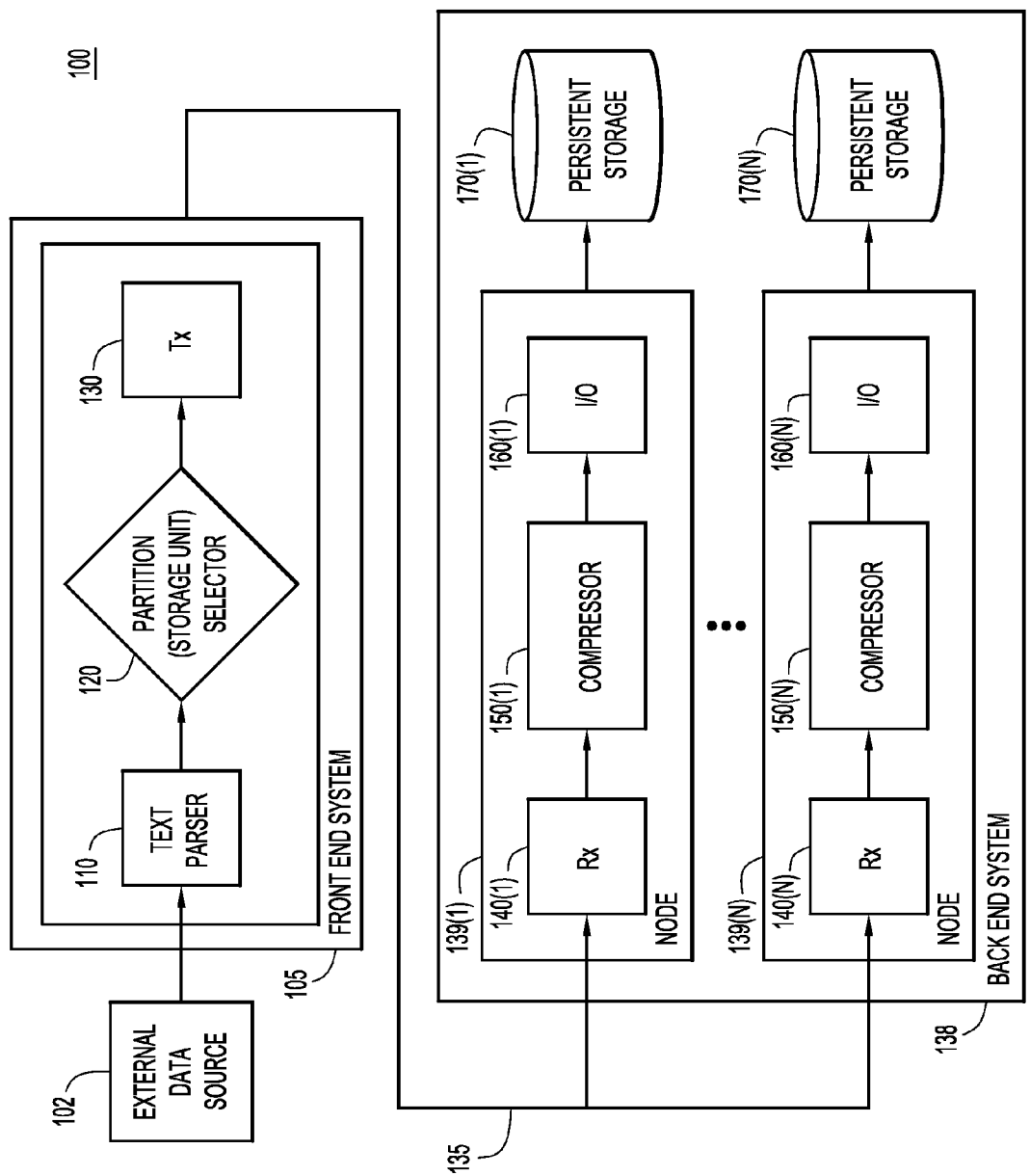
FIG. 1 is a diagrammatic illustration showing an example of a massively parallel database system in which information is compressed and stored in accordance with an embodiment of the present invention.

Present invention embodiments hierarchically compress data and manipulate a compression hierarchy to defer or reduce computation on the compressed data during query evaluation. This allows network capacity and bandwidth to be optimized as well as database performance to be accelerated, as fewer resources are needed to perform desired computations. Present invention embodiments allow calculations, e.g., comparisons, to be performed without evaluating each value of compressed data. According to present invention embodiments, performed work may be reduced by performing computations on a subset of the total number of compressed values to obtain a desired result.

Present invention embodiments enable a plurality of compressed outputs to be produced, with each output having a representation based upon an order of progression through one or more nodes of a compression hierarchy. In some embodiments, for a given set of data, an output having a measure of compression that is higher than any of the other compressed outputs may be selected from among the plurality of compressed outputs generated by the compression hierarchy for storage in memory. Techniques are also presented for reducing or deferring computations on compressed data by manipulation of the compression hierarchy during query evaluation.

The compression schemes of present invention embodiments are used to represent values of at least three primitive types: integer, character, and double. Integer values may be high precision, e.g., 256 bit signed values. Character values may be fixed or variable-length byte strings, and double values may be binary 64 bit values. The compression techniques of present invention embodiments apply to each of these types of representations. Value types are not intended to be limited to integer, character and double data types, and may apply to additional value types as well.

Present invention embodiments also apply to additional data types including null values and structured database values. Null values, indicative of an unknown data value, may be handled by converting the null values to a different representation, e.g., an independent stream of Boolean values (e.g., 1-bit integers), to be compressed. Structured database types (time+timezone, interval) may be handled by converting the structured values to independent streams of integer values for each part of the data structure. In some embodiments, information correlating these transformed values or structures with the original values or structures, may be stored as well.

Present invention embodiments are also not limited to a particular representation of characters. For example, American Standard Code for Information Interchange (ASCII), Extended Binary Coded Decimal Interchange Code (EBCDIC), multi-byte representations of Unicode Transformation Formats such as UTF-8 or UTF-16, or any other suitable representation of characters may be used.

The techniques of present invention embodiments generally apply to, but are not intended to be limited to, massively parallel systems in which data is stored in columnar format (e.g., in which columns of a data table are stored across multiple databases or storage units or storage locations). Databases or storage units may be local to or remote from each other. Storing data in columnar format may have significant advantages in terms of achieving a higher compression ratio (as compared to storing data in row format), as data is usually more structurally similar in columnar format and a higher compression ratio may be achieved. Accordingly, data is generally stored in compressed format, allowing fewer memory resources to be consumed for storage. Storing data in columnar format also has advantages in terms of data transport or I/O time, as only those columns which are of interest for a query are retrieved from storage.

FIG. 1 shows an example of a massively parallel database system 100 in which data is being loaded into the system and stored. An external data source 102 comprises data that is to be stored in any of persistent storage units 170(1)-170(N). The data may be processed by a front end system 105, which may comprise a text parser 110, a partition or storage unit selector 120, and a network interface unit Tx 130 that transmits data over a high speed network 135 to nodes of a back end system 138. Partition or storage unit selector 120 may select one or more storage units 170 for storing incoming data, which is compressed prior to storage. Back end system 138 may comprise a series of blades or nodes 139(1)-139(N), each blade comprising a network interface unit Rx 140 for receiving data, a compressor 150 for compressing received data, and an I/O interface 160 for sending and receiving compressed data to persistent storage units 170. Compressor 150 may comprise one or more compression nodes, each node capable of compressing data according to a compression algorithm. Data may be compressed in a hierarchical (recursive) manner, such that compression is applied multiple times to a set of data, wherein the type of compression selected for a subsequent round of compression is influenced or determined by the type of compression selected for a preceding round of compression, and the data compressed in a subsequent round is all or a part of the output of a previous round of compression. Output data from compressor 150 may be in a compressed data structure format, and the compressed data structure format may be serialized or flattened into bits prior to being sent to storage via the I/O interface 160. Hierarchical compression operations performed at compression nodes are described in additional detail herein.

In general, hierarchical compression must include terminal or leaf nodes, where no further compression is performed on the output of these nodes. Hierarchical compression may also include internal nodes, where one or more components of the output require further compression. This further compression may be again hierarchical, resulting in a child node which is itself an internal node, or may be simple, resulting in a child node which is a terminal node.

The system may comprise a plurality of blades, e.g., for a system containing N blades, the system may comprise network interfaces Rx 140(1)-140(N), compressor 150(1)-150(N), I/O interface 160(1)-160(N), and persistent storage unit 170(1)-170(N). The environment may include one or more blades/nodes 139, and one or more front end systems 105. The front end system 105 and the back end system 138 may be on the same server, or may be on separate servers, and may be implemented by any combination of software and/or hardware modules.

Blades/nodes 139 and front end system 105 may be remote from each other and communicate over a network 135. The network may be implemented by any number of any suitable communications media (e.g., wide area network (WAN), local area network (LAN), Internet, Intranet, etc.). Blades/nodes 139 and front end system 105 may be local to each other, and may communicate via any appropriate local communication medium (e.g., local area network (LAN), hardwire, wireless link, Intranet, etc.).

In this example, and as is common for many systems having a massively parallel architecture, data may be compressed according to present invention embodiments and stored in one or more persistent storage units in columnar format. For example, a table comprising many rows of data may be divided according to a scheme among the different storage units/blades. For example, the rows may be directed "round-robin" style to different blades (e.g., a row of data directed to each storage unit), or "round-robin" style in batches larger than a single row, or according to the values found in one or more columns of each row.

The column-oriented architectures and computational techniques of present invention embodiments operate on compressed data, minimizing the need to provide access to decompressed data. Additionally, in certain situations, computations do not require that the actual values of the data (or that each value in a set of data) be considered, which helps enable reduced or deferred computation on compressed data.

Figure 2:
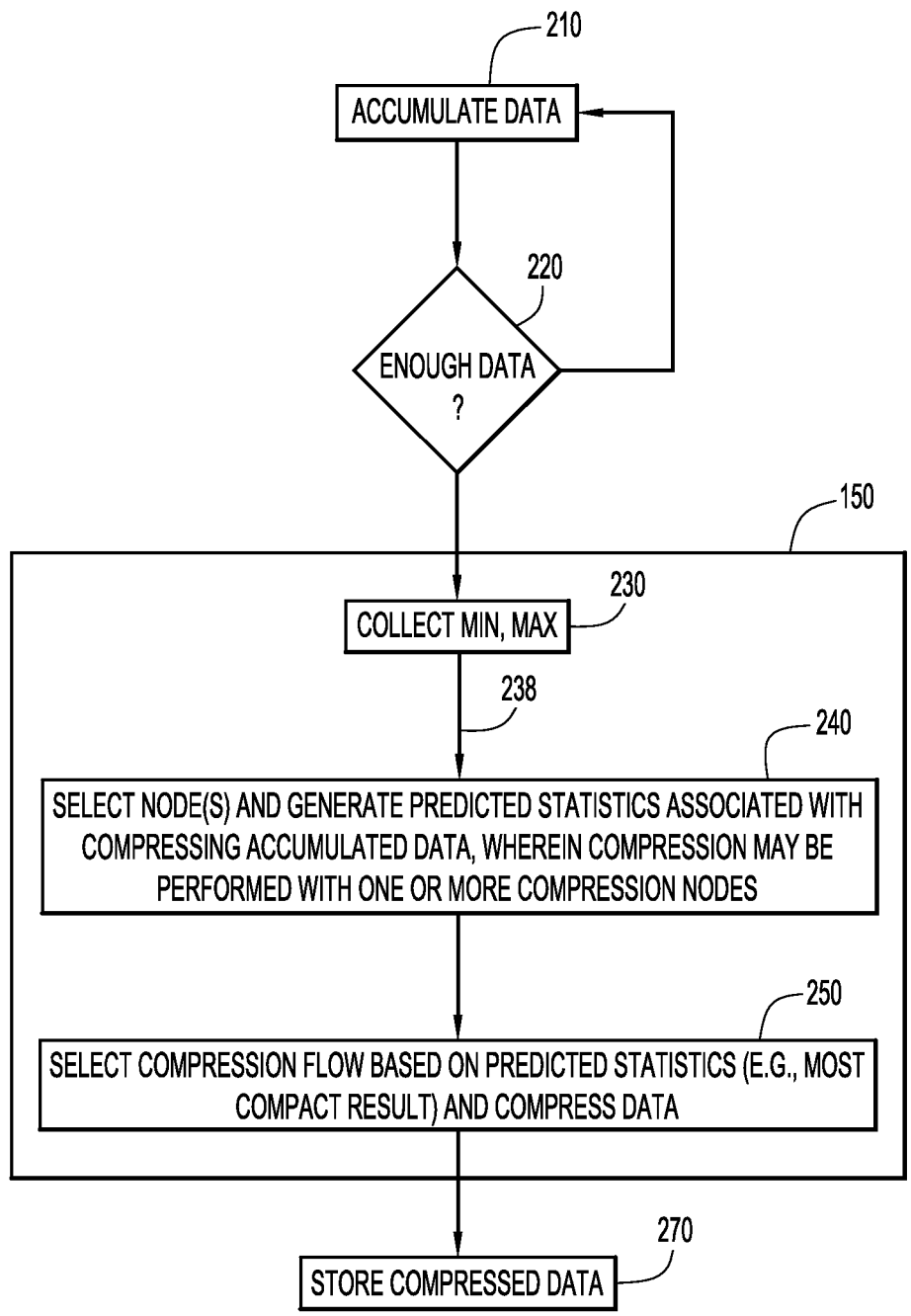
FIG. 2 is a procedural flow diagram of a manner of creating a hierarchy of compression nodes and selecting a compression flow in accordance with an embodiment of the present invention.

A manner of creating a hierarchy of compression nodes by compressor 150 in accordance with an embodiment of the present invention is illustrated in FIG. 2. At operation 210, data from an external data source 102 is accumulated. At operation 220, a determination is made as to whether a sufficient amount of data to be compressed has been collected. When sufficient data is present, the data is provided as input into compressor 150, where the data may be recursively and/or hierarchically compressed using a hierarchy of compression nodes.

At operation 230, the minimum value and the maximum value of the data to be compressed may be collected and stored. The minimum and maximum values may be used in conjunction with subsequent query processing to determine whether the corresponding compressed data is relevant to a particular evaluation (e.g., within a range of a specified parameter as part of a query evaluation). For example, the minimum and maximum values may also be used with subsequent query processing to compute the result of an operation such as x>0; if the minimum value for a collection of data is 1, then the result of x>0 for every value in the collection is known to be "True", without looking at each value separately. At operation 240, statistics (e.g., predicted statistics) are collected regarding compressing accumulated data 238 with one or more compression operator(s)/compression node(s). These statistics are used to decide among compression schemes and are not retained. At operation 250, one or more compression operator(s)/node(s) are selected based on the results of operation 240 and desired compression goals (e.g., smallest size, shortest compression time, etc.), and the data is compressed. At operation 270, compressed data is stored in one or more storage units 170 (FIG. 1).

As a general example of compression, data may be provided as input into a first compression node, producing one or more compression parameters and zero or more collections of data (e.g., compressed data). These compression parameters and collections of data may later be provided as input to a corresponding decompression node to recover the original data values. As an example of hierarchical or recursive compression, these collections of data may each individually be provided as input to a second or subsequent compression node, which in turn may produce a second set of compression parameters and zero or more collections of data. The number of values and type(s) of values in each collection of data may differ from the number of values and type(s) of values in the original collection of data.

Figure 3:
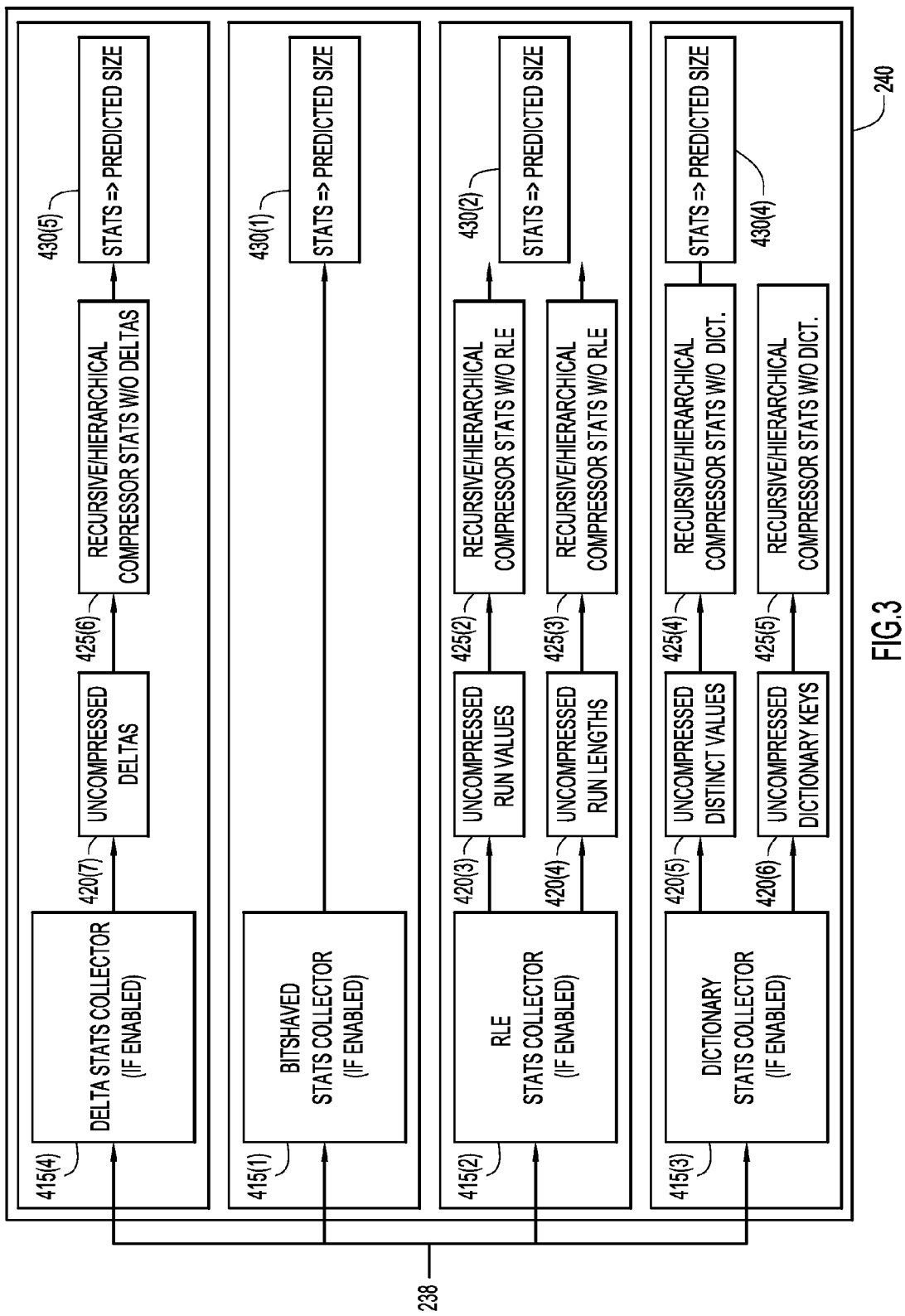
FIG. 3 is a procedural flow diagram of generating predicted compression statistics for hierarchical compression of data in accordance with an embodiment of the present invention.

Both operations 240 and 250 may utilize recursive operations. Operation 240 predicts the compressed size of the data by generating statistics associated with compressing the data. As shown in FIG. 3, for each enabled compression operator/node, data is fed into a statistics collector for that operator. The zero or more data outputs of the compression operator are each first produced during statistics gathering, and are fed recursively into another statistics collector 240 at operation 425($x$), possibly with some compressors disabled. In general, the results of the recursive statistics collectors 425($x$) and the parent statistics collector 415($x$) are combined at statistics module 430($x$) to predict the size of the compressed result. Generation of such statistics allows a path to be chosen, at operation 250, selecting which compressors will be used at each level of the compression hierarchy to produce the best result. At operation 270, the compressed data is stored in one or more storage units 170. Descriptions and examples of compression nodes are provided herein.

Figure 6:
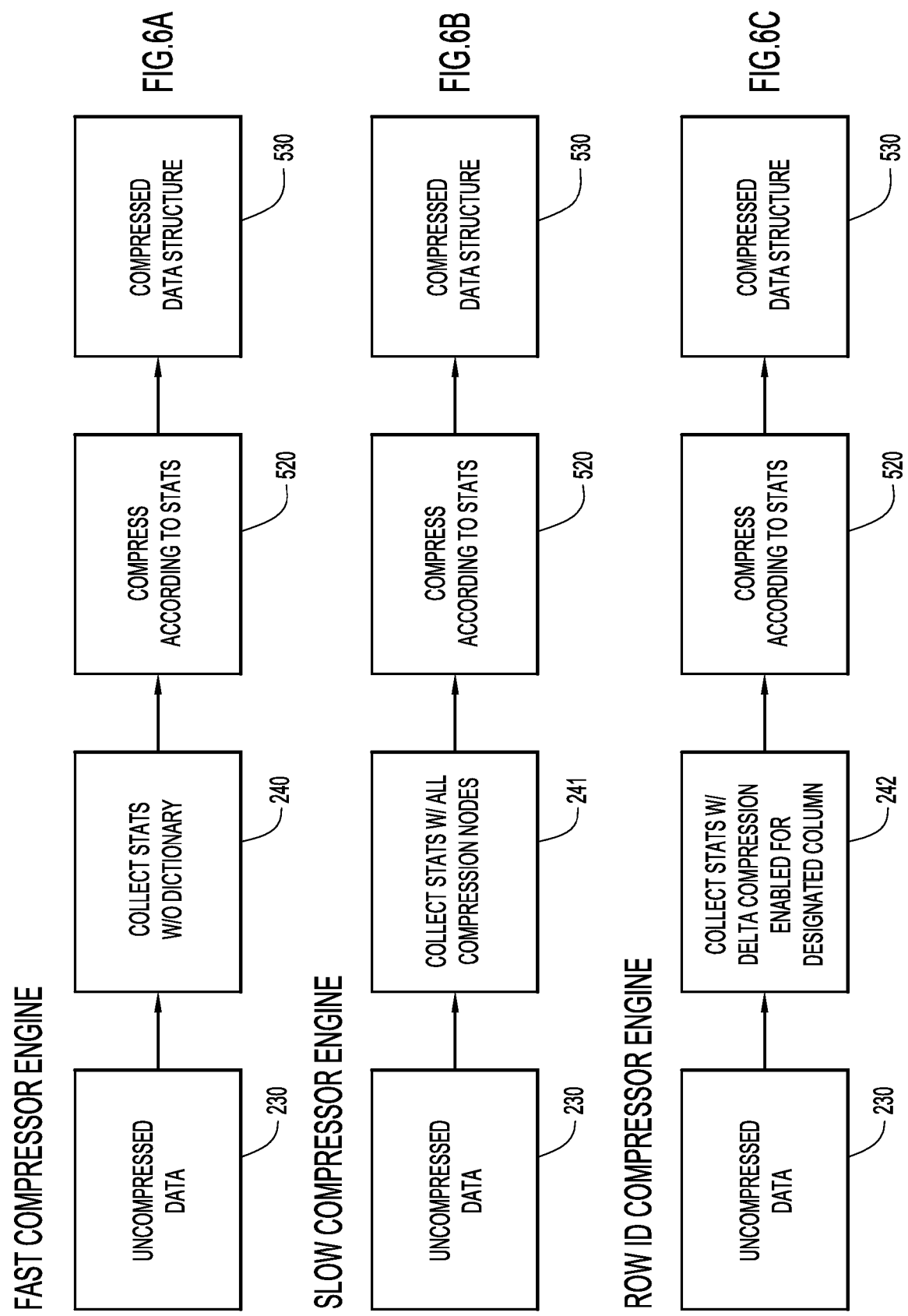
FIGS. 6A-C are procedural flow diagrams for compression for a fast compressor engine, a slow compressor engine, and a Row ID compressor engine according to embodiments of the present invention.

FIG. 3 shows an implementation of operation 240, showing computation of predicted compression statistics on the output (e.g., children) of various compression nodes. Compressor 150 (see FIG. 1, FIG. 6), may predict a compressed size and compute associated statistics (e.g., compression time, percentage of size reduction from compression, etc.) for uncompressed data. FIG. 3 provides an example workflow for computing such statistics recursively. These statistics may then be used to select one or more compression nodes for data compression during operation 250.

Uncompressed data 238 is fed into a statistics collector for each enabled compression node. For example, incoming data 238 may be directed to a delta compression statistics collector, a bitshaved compression statistics collector, a Run Length Encoding (RLE) compression statistics collector, a dictionary compression statistics collector, and so forth.

The compressor may be customized to selectively enable or disable compression nodes, depending upon the characteristics of the data. Fine tuning of the types of available compression nodes may accelerate the speed of the compressor. In some data sets, the type of data may be well characterized, e.g., from previous computations, and therefore, the types of compression which will be most efficient may be known. In such cases, certain types of compression may be disabled to accelerate compressor performance. For example, dictionary compression, which is typically computationally heavy, may be disabled for data in which such compression does not provide an appreciable benefit, or in contexts such as the compression of intermediate results where the expense of good compression may not be worth the time spent on dictionary compression.

In general, incoming data 238 is directed to a statistics collector 415 associated with a particular type of compression node. As data is provided to 240 in a streaming manner, data is provided to each of the nodes 415($n$) in a streaming manner, one value at a time. The statistics collector 415 generates zero or more outputs 420 for a particular type of compression (it is noted that there is no uncompressed data output from the bitshaved statistics collector), and thus, nodes 415($n$) perform much of the work associated with compression by computing outputs at 420($n$), also in a streaming manner. The outputs are further evaluated at compression statistics collector 425 (invoking 240 recursively). Recursion will continue until terminating at a bitshaved compression node. Termination may also be forced by disabling other compression modes according to the depth of recursion, or according to which compression modes have been used at higher levels of the recursion.

Statistics are collected for each evaluated compression path at operation 430. Depending upon the order of applying various compression schemes, many different outputs, each output associated with a particular compression path or flow, may be generated for a given set of data. The statistics for each path may be compared to one another in order to determine an optimal compression flow for a given set of data, with the optimal compression flow used to govern compression at operation 250.

As mentioned previously, compression statistics collectors 425($n$) may perform hierarchical/recursive statistics collection. The output streams at 420($n$) are fed recursively into compression statistics collectors 425($n$), which are modified versions of operation 240, one value at a time. In some embodiments, only bitshaved statistics collection is enabled and the statistics module 430 reports an absolute compressed size at 430(1). For example, the compressed size for bitshaved output may be reported as the number of values N times the number of bits per value B, plus the size of the base value V, plus a constant size C for storing the compression parameters (e.g., number of bits in base value, number of bits B, shift amount).

In other embodiments, as shown in FIG. 3, recursive/hierarchical compression at compression statistics collectors 425 may exclude the type of compression selected previously, from being selected subsequently. For example, for RLE encoding during compression at compressors 425(2) and 425(3), if the data has been previously compressed using RLE compression, then the compressor may be configured: (1) to exclude further RLE compression in cases in which applying the same mode of compression would not yield a further significant improvement in compression; and (2) to exclude certain types of compression which would not likely yield a further significant benefit when combined with a previously applied compression scheme, e.g., applying RLE to dictionary encoded data.

In still other embodiments, each of compression statistics collectors 425($n$) invokes 240 with a particular compression mode removed from consideration. After one or more rounds of recursion have been applied, the set of compression modes is reduced to bitshaved and the recursion terminates.

In other embodiments, instead of excluding a particular compression mode during recursion, another criteria is utilized, e.g., a termination condition, etc. For example, the system may count the depth of recursion and disable all compression nodes except for bitshaved compression, in cases where the recursion depth has been determined to reach a specified threshold. At this level of termination, an absolute compressed size for bitshaved data has been computed, as noted above, and associated statistics with bitshaved data is returned. Accordingly, the recursive "parent" node receives a record or other indication stating that bitshaved compression was considered, and is predicted to produce data of a certain size.

More generally, at statistics module 430, several predicted sizes are considered, one for each compression scheme. The smallest predicted size or best compression scheme (e.g., by some other criterion, such as a bias to avoid delta compression) is selected, and only the statistics for the smallest predicted size and associated compression scheme are returned as the result from operation 240. For example, the data returned to the recursive parent will indicate that RLE should be used, with a certain size. This is received at node 425 in the parent. At statistics module 430 in the parent, the sizes of zero or more children are summed, along with compression parameters necessary for selecting this parent scheme, to produce a predicted size for the parent scheme. This recursive unwinding repeats until reaching the original call to the statistics module. The lower-level recursive steps (the "another compression node") may determine which of the higher-level compression nodes are used (the "first compression node" above).

As a further example, RLE statistics collector 415(2) may generate output types of run values 420(3) and nm lengths 420(4). The RLE compressor processes a set of uncompressed inputs, and produces two uncompressed outputs as an intermediate result. An actual array of run lengths as convenient integers, and another conventional, uncompressed array of values are produced as outputs. The outputs are evaluated for further compression at statistics collectors 425(2) and 425(3) in which RLE is not considered. Upon determination of a most compact form for this pathway, statistics are generated for the predicted characteristics of the data at statistics module 430(2)—the predicted size is the total size of the RLE compressed data.

Similarly, dictionary statistics collector 415(3) may generate outputs of values 420(5) and keys 420(6). The outputs are fed into statistics collectors 425(4) and 425(5) to determine which recursive compression scheme will produce the best result. In some embodiments, the recursive/hierarchical compressor may include all types of compression nodes, such that the same type or different type of compression may be applied multiple times to a set of data. In other embodiments, some compression schemes may be excluded from further application based upon the type of compression selected for a set of data. For example, if the data has been previously compressed using dictionary compression, then the recursive compressor may be configured to exclude dictionary compression. In some embodiments, applying RLE compression to the dictionary values output 420(5) may be excluded because these values are known to be distinct values; RLE compression may still be enabled for the dictionary keys output 420(6), since the keys may include repeated data. Statistics are combined at operation 430(4). In a preferred embodiment, the dictionary "values" is generally always compressed using the bitshaved compressor if the data type is integer data, in order to make it easier to perform random access into the compressed dictionary when processing the data at a subsequent point in time. Otherwise, e.g., for varchar data, the dictionary is generally decompressed into a more convenient representation, e.g., an array of uncompressed values, when using the dictionary-compressed data at a subsequent point in time.

Likewise, delta statistics collector 415(4) may generate output types of uncompressed deltas at 420(7). The outputs may be evaluated at statistics collector 425(6) to determine which type of recursive compression should be applied. Statistics from 425(6) are combined with statistics from 415(4), e.g., a base output, at operation 430(5) to predict the resulting compressed size using delta compression.

Bitshaved statistics collector 415(1) generates no outputs for further consideration. The bitshaved statistics collected at 415(1) are sufficient to compute the predicted size of the compressed data at operation 430(1). Bitshaved is generally not subject to further compression.

The return result after recursive unwinding may be a structure indicating, e.g., that RLE should be used, with run values dictionary compressed, with dictionary keys bitshaved 5 bits each and dictionary values bitshaved 12 bits each, and (back at the RLE level) run lengths bitshaved as well at 3 bits each. Such a structure may look like: RLE (dictionary (bitshaved 12 bits, bitshaved 5 bits), bitshaved 3 bits).

As indicated above, the statistics computation is made for each compression node type, and indicates which nodes should be used for compressing data. The compressor then honors these decisions at operation 250 to produce a compressed structure that may be serialized to a sequence of bits, the final compressed form.

The outputs of multiple statistics collection nodes may be combined when determining total predicted compression size at 430. For example, for dictionary compression, then the predicted size may be determined based upon a combined predicted size of values and keys, plus the predicted size of the dictionary compression header.

Various compression nodes are understood to fall within the scope of present invention embodiments. Additional types of compression nodes, in addition to those shown in FIG. 3, are discussed herein. Descriptions and examples of different types of compression nodes are provided as follows.

Bitshaved compression, usually used as a terminus for every type of data compression, e.g., varchar data uses bitshaved for each character value, represents values as offsets relative to a base value, storing a base value of a sequence (e.g., a lowest value, minimum value, zero, etc.) and the difference between the base value and another value of the sequence. If the base value is the minimum value, all offsets will be positive, and no sign bit will be required per value. Offsets are preferably selected according to the minimum number of bits required for the largest offset. Although additional bits are allowed, minimizing the number of bits is preferred for on-disk storage.

Bitshaved representation also allows a scale factor to be applied to the offset. The scale factor may be a power of 2, a power of 10, or an arbitrary multiplicand. This is useful, e.g., regarding timestamp data, which often has many trailing zeros in a decimal representation.

For a sequence of input values which is constant, a bitshaved primitive compression node may be used to compress the sequence. For example, a sequence of input values: 2, 2, 2, 2, 2 may be encoded using bitshaved compression as bitshaved (base=2, scale=0, bits per value=0, bits=(0, 0, 0, 0, 0)).

For a sequence of input values differing by a variable amount, bitshaved compression may also be suitable for compressing the sequence. For example, a sequence of input values: 103, 98, 104, 97, and 98 may be encoded using a bitshaved primitive compression node as bitshaved (base=97, scale=0, bits per value=3, bits=(6, 1, 7, 0, 1)).

Another example of a compression node is RLE (Run Length Encoding). RLE is generally applied to a sequence of integers and has two children: a set of values and corresponding lengths. For each value, the number of times that the value repeats in a sequence is stored as length n. An example of applying RLE compression to the sequence of input values: 2, 2, 2, 3, 4, 4, 4, 5, 8, 8, 9 using a RLE compression node is rle(values=(2, 3, 4, 5, 8, 9), lengths=(3, 1, 3, 1, 2, 1)). Thus, because the value '2' repeats three times, a corresponding length of '3' is stored as well. Additionally, RLE usually produces an output sequence that is shorter than the input sequence (the sequence to be compressed), and only contains values appearing in the sequence. However during subsequent optimized processing, RLE encoded data may be produced that has some lengths=0, and thus, may have values which do not appear in the sequence being represented.

Another example of a compression node is dictionary encoding. Dictionary encoding also has two children: a set of values, usually distinct from each other, as well as a corresponding set of keys, which are indices into the values. Additionally, dictionary encoding usually produces a set of dictionary values that is smaller than the input sequence (the sequence to be compressed), and generally only contains values appearing in the sequence. For uncompressed input data, each of these aforementioned conditions will usually apply. During compression, the order of the dictionary entries may be arbitrary, and therefore, the entries may be sorted as indicated in a dictionary coding header, to improve compression of the values and simplify certain types of computations performed on the values. Dictionary compression may be applied to values of any type.

For example, a sequence of input values: "Y", "Y", "Y", "N", "N", "Y", "Y", "Y", "N" may be encoded using dictionary encoding compression as dict(sorted=ascending, values=("N", "Y"), keys=(1, 1, 1, 0, 0, 1, 1, 1, 0)). In this example, "N" has a corresponding index of '0', and "Y" has a corresponding index of '1'. For values having lengthy character descriptions (e.g., city names, department names, etc.) a considerable benefit may be achieved with dictionary compression, as the resources needed to represent each value along with an associated index are much smaller than the resources needed to represent every full length occurrence of the value.

In some embodiments, the output of the dictionary encoding compression node may be further compressed, using other compression primitives, e.g., keys may be further compressed using bitshaving or RLE by operation 240.

Another example of a compression node is delta encoding compression node. Delta encoding may be used to compress a sequence of input values, usually numeric, e.g., sequence numbers or row identifiers. Delta encoding stores the first value of a series of input values as a base value and the difference between each pair of adjacent values.

Delta encoding compression may be used to compress a sequence of input values increasing by a constant amount. For example, a sequence of input values: 17, 19, 21, 23, 25 and 27 may be encoded using delta encoding compression as delta (base=17, deltas=(2, 2, 2, 2, 2)). In this example, the number '17' was selected as the base value, and the difference between the base value and the next value of '19', may be represented as '2'. Likewise, the difference between the value of '19' and the next successive value of '21' may also be represented as '2'. Once the deltas are compressed, this compression scheme utilizes fewer memory resources than the original sequence of input values.

As another example, for a sequence of input values increasing by a variable amount, a delta encoding compression node may also be suitable for compressing the sequence. For example, a sequence of input values: 100, 203, 301, 405, 502 and 600 may be encoded as delta(base=100, deltas=(103, 98, 104, 97, 98)). This scheme also utilizes fewer memory resources than the original sequence of input values once the deltas are compressed.

It should also be noted that this example utilizes a sequence which may be further compressed using bitshaved compression. As disclosed herein, compression primitives may be applied recursively/hierarchically, and thus, the output of a first compression node may be further compressed using the same or a second compression node. Sequence: 103, 98, 104, 97, 98 may be further compressed as bitshaved(base=97, scale=0, bits per value=3, bits=(6, 1, 7, 0, 1)).

Another example of a compression node is fixchar compression node. Fixchar compression, generally applied to a fixed byte representation of characters, converts each string value into an integer. Fixchar allows an integer representation of character values, including all-digit character values. Fixchar may be utilized when string lengths are constant and less than the supported maximum length of the integer, or may have an associated lengths child.

For example, a sequence of string input values: "A3Z1", "A3Z2", "A3Z9" may be encoded using fixchar compression. Each string is considered as a sequence of bytes in memory. This sequence of bytes is then interpreted as a base-256 integer. In some embodiments, conversion from character to integer values treats the character value as a "big endian" integer so that the resulting integers sort in the same order as the original strings under memory-order sorting. Another embodiment first converts the character value to a collation form for a specific lexicographic ordering locale, and then converts the collation form to an integer. Thus, "A3Z1", "A3Z2", "A3Z9" may be represented as fixchar(length=4, bits=(1093884465, 93884466, 93884473)).

It is noted that this sequence of integers may be further compressed using other compression nodes, e.g., bitshaved compression or delta compression, which may operate on integer data according to present invention embodiments.

Although not shown in this example, in other representations, such as 6-byte character values, character values may also include trailing spaces. In such a case, if all values have trailing spaces, then after conversion to integers, subtraction of the minimum integer value from the bitshaved data may cause trailing spaces to become trailing zero bytes, which are then compressed by applying a scale factor.

Yet another example of a compression node is the varchar compression node, which is typically also used to compress character data, and has two children, bytes and lengths. Individual characters are converted to an ASCII or equivalent representation and treated as 8-bit integers. Multi-byte characters may be handled by encoding as a sequence of smaller values (as in UTF-8 or UTF-16), with each set of smaller values treated as an integer, or compressed directly with each character value generally treated as a wider integer value. Varchar may have an associated lengths child to represent the length of the string, which may be variable. According to present invention embodiments, the integer representation as well as the lengths child (lengths of the character strings) may be further compressed using other compression nodes, e.g., bitshaved compression or other compression schemes such as Lempel-Ziv-Welch (LZW).

The double compression node, whose child contains the integer binary 64 representation of the double value, is similar to fixchar compression. The bits of a double value are either interpreted directly as a 64-bit integer to be compressed, e.g., by RLE, dictionary, or bitshaved compression, or are first converted to a collation form suitable for integer comparisons. A collation form for an IEEE-754 binary32 or binary64 floating point value may be obtained by the algorithm: if float>=0; then output=reinterpret float as integer; else output=minus(reinterpret minus(float) as integer).

Figure 4:
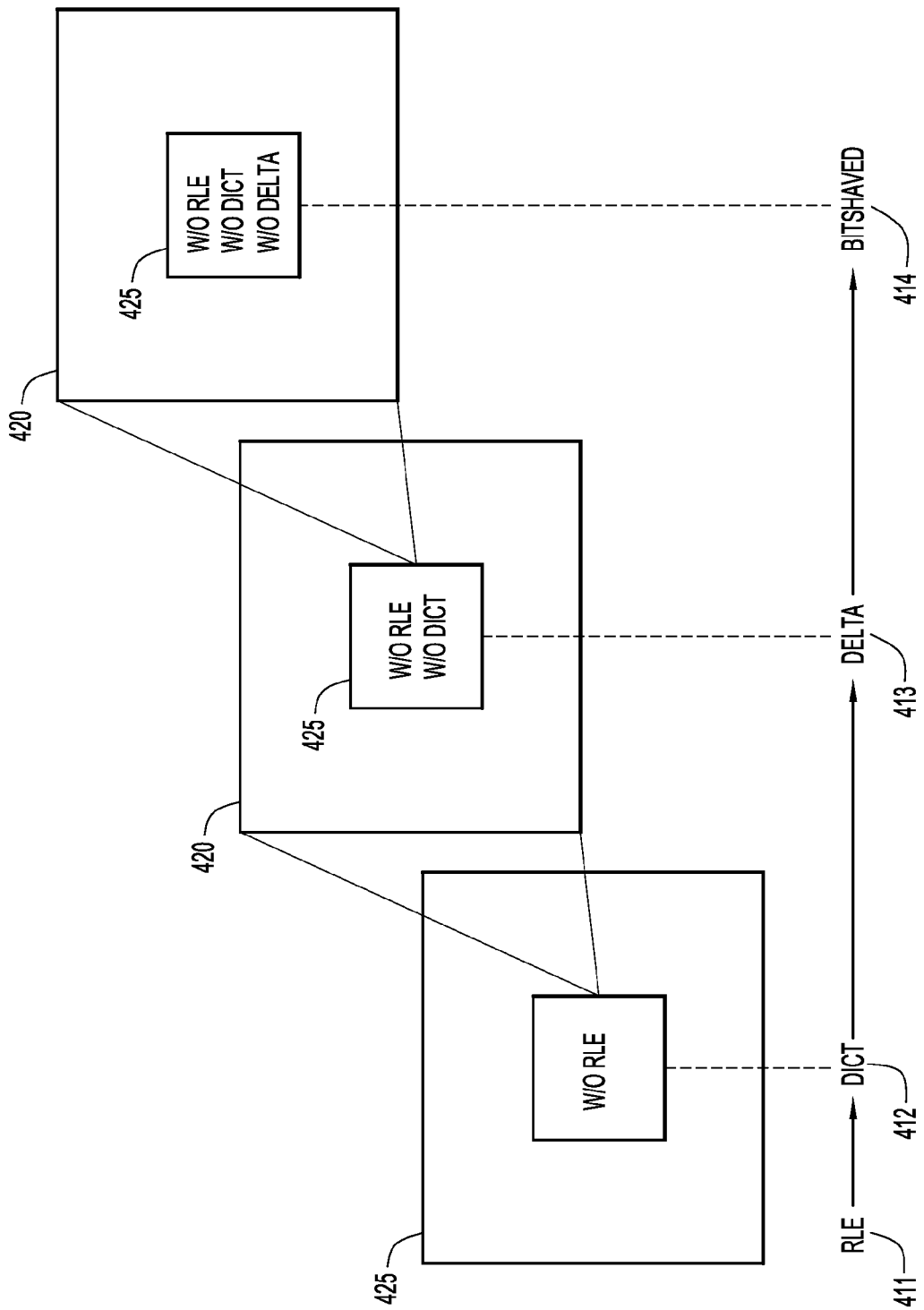
FIG. 4 is an example of recursively calling a compressor in accordance with an embodiment of the invention.

FIG. 4 shows an example of recursively calling a compressor, according to present invention embodiments. At 411, a RLE statistics collector is initially selected at 415(2) (FIG. 3). At 412, recursive compressor is called at 425 and dictionary compression is selected. At 413, recursive compressor 420 is called at 425, and delta compression is selected. At 414, recursive compression 420 is called at 425 and bitshaved compression is selected. Once bitshaved compression is selected, operations involving recursively calling 420 end.

Figure 5:
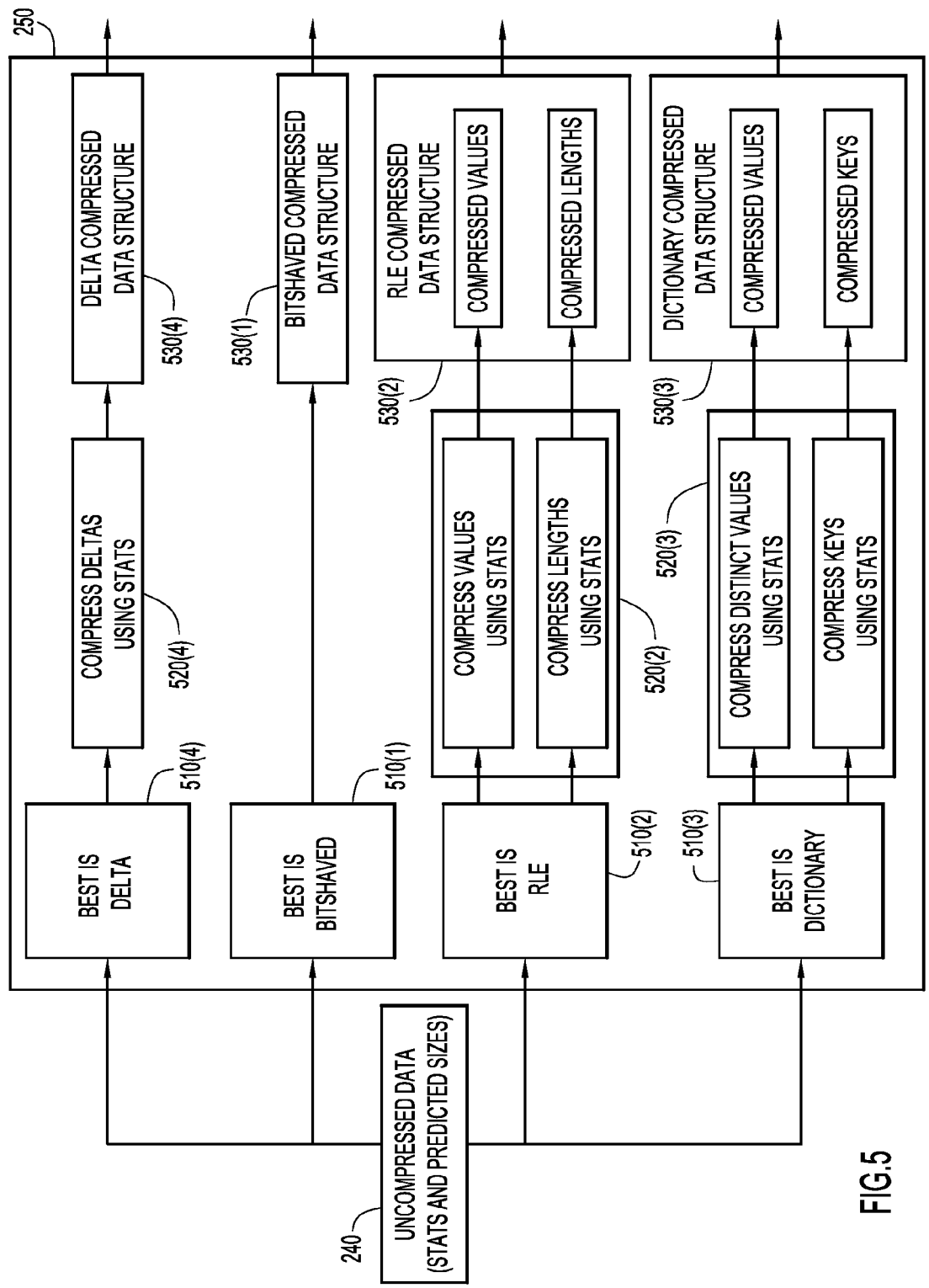
FIG. 5 is a procedural flow diagram showing how data may be compressed in a hierarchical manner, based on predicted statistical data, in accordance with an embodiment of the present invention.

FIG. 5 shows an example of a compression engine selecting a compression node for uncompressed data, based upon predicted compressed sizes and associated statistics or other specified criteria from operation 240. At operation 250, uncompressed data along with compression statistics and predicted sizes are provided to a compression engine. Based upon the predicted sizes and associated statistics, a compression node or compression flow comprising multiple compression nodes that best compress the data is selected. Depending on whether the data is integer, character, double, etc., some compression nodes will be more efficient at compressing a particular type of data than other types of compression nodes. For example, if the best type of compression is determined to be delta compression, then a delta compression node and associated compression flow will be selected at operation 510(4). If the best type of compression is determined to be bitshaved, then a bitshaved compression node and associated compression flow will be selected at operation 510(1), and so forth for RLE flow at operation 510(2) and dictionary flow at operation 510(3). It is noted that operations involving the bitshaved pathway are distinct from the remaining pathways. In general, the bitshaved data structure is produced by (1) subtracting the minimum value from each value, (2) either shifting by the number of bits determined by the bitwise statistics or scaling by the scale factor determined by the greatest-common-divisor of the differences between values, (3) encoding using only the number of bits necessary for the difference (e.g., maximum value−minimum value), and (4) packing these n-bit encoded values together in a bit array. In contrast, the other pathways include operations at 520(x), which are recursive compressor calls.

Again, it is understood that not all of the types of compression discussed herein are shown, but are understood to fall within the scope of present invention embodiments. Once a compression node is selected, the data is processed according to a particular compression flow, as shown at operations 520(2)-520(4), in a hierarchical or recursive manner, and packaged into a data structure for storage at operations 530(1)-530(4).

As a more specific example, at operation 510(2), RLE is selected as an optimal compression flow and the uncompressed data is parsed into two output types: lengths and values. At operation 520(2), each data type (lengths and values) is compressed according to the selected optimal flow determined from associated statistics and predicted sizes by recursive invocations of operation 250, one invocation for each of lengths and values. At operation 530(2), the two sets of compressed data are packaged into a data structure that is the output of module 250. The other compression flows progress through a similar series of actions.

It is understood that present invention embodiments encompass not only the specific compression nodes described in reference to FIG. 5, but also, compression nodes associated with other types of compression as well.

FIGS. 6A-C show examples of different workflows for compression engines: (1) a fast compression engine (top panel) in which a particular computationally intensive type of compression (i.e. dictionary compression) is disabled, (2) a slow compression engine (bottom panel) in which statistics are collected on all compression nodes, and (3) a Row ID compressor engine. At operation 230, uncompressed data is fed into the compression engine. At operations 240-242, statistics are collected on compression nodes. Dictionary compression may be enabled or disabled, depending upon the characteristics of the data. For the fast compressor at 240 (FIG. 6A), dictionary compression is disabled, such that statistics are collected without dictionary compression. For the slow compressor at 241 (FIG. 6B), dictionary compression is enabled, such that statistics are collected for all compression types. At operation 520, data is compressed based upon statistics obtained from trying different compression nodes. At operation 530, a compressed data structure is generated based upon the type(s) of compression utilized at operation 520.

In still other embodiments, as shown at FIG. 6C, some compression modes may be disabled based on table schema information or data type information. For example, delta compressed data does not enable many compressed-computation optimizations. Therefore, delta compression is generally applied only to columns that are not often used in computations, e.g., an internal ROW ID column, which is generally sequential and well-compressed using delta compression. In this case, a compressor engine at 242 that enables Delta compression on a ROW ID column would be selected and statistics collected at 242, while most other compressors would not enable delta compression.

The techniques presented herein do not restrict the order of the compression hierarchy. While the compressor may limit itself to certain hierarchies and depths, dynamically, at runtime, a representation may be obtained from a particular progression through a sequence of compression nodes, such as: RLE(RLE(RLE(fixchar(bitshaved),bitshaved),bitshaved),dictionary(bitshaved,bitshaved)).

The criterion for choosing the best encoding at 510 may more complex than simple compressed size. For example, in some embodiments, a 'best' representation may be determined which penalizes certain compression modes, e.g., delta compression, which is computationally expensive, by providing a computational cutoff of computing a compressed result that is at least half the size of the next best alternative. In other embodiments, a compression scheme with fewer levels of recursion may be preferred or as long as this is within a factor of 1.01 (or some other factor) of the next best alternative.

Figure 7:
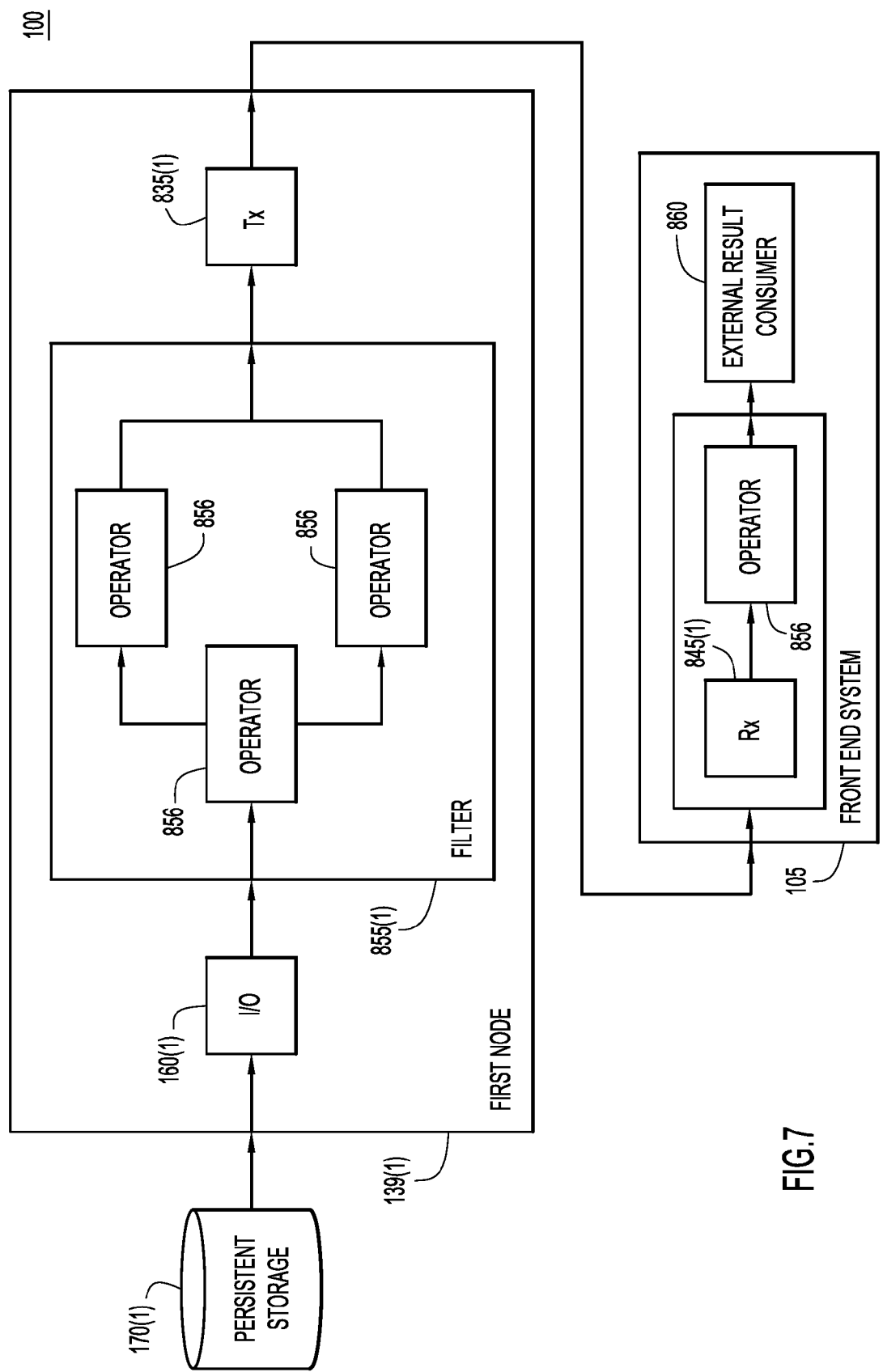
FIG. 7 is a diagrammatic illustration showing an example of a massively parallel database system in which compressed information is accessed during query processing in accordance with an embodiment of the present invention.

FIG. 7 shows an illustration of query processing to identify and extract data that has been stored in compressed format in one or more persistent storage unit(s) 170. Upon receiving query parameters from a user/host, the query is evaluated to identify and retrieve relevant data stored in compressed format in persistent storage unit 170(1). The flow of the data from the storage unit 170(1) through node 139(1) and the front end system 105 are shown. It is understood that multiple storage units as well as multiple nodes may be present. For simplicity, only one storage unit and node are shown.

Data from persistent storage unit 170(1) progresses through node 139(1), and in particular, through I/O module 160(1), filter module 855(1) and transmission module Tx 835(1) for transmitting data to front end system 105. Filter module 855(1) may contain one or more operators 856. A generic representation of operators 856 is shown at node 139(1) as well as the front end system 105. Front end system 105 comprises a receiving module Rx 845(1) for receiving data from node 139(1), an operator 856, and an external result consumer container 860 that is used to package information to be provided/displayed to a consumer. Although node 139(1) and front end system 105 could perform any operation associated with operator 856, in practice, operators which govern access to persistent storage will more likely be utilized on node 139(1) and operators governing returning data to an external consumer will more likely be utilized on front end system 105. Accordingly, operators may interact with data in a different manner on the front end and the back end.

Operator 856 may include many different types of functions, including but not limited to, decompressing data obtained from persistent storage, filtering decompressed data based upon query parameters, performing join or aggregation operations, performing queries or transformations on compressed data (without first decompressing the data) and passing data relevant to a query to the front end system. Operator 856 may decompress data that has been stored in compressed format by any of the compression nodes according to present invention embodiments. Data 170(1) may be evaluated to determine data of relevance to the query, wherein the data is evaluated in compressed format. Once relevant data has been identified, the data may be filtered and provided to front end system/host 105 for display to a user. Decompression may occur at any point in this sequence, including immediately before display to the user. In general, decompression is deferred for as long as possible, in order to reduce the amount of computation required to manipulate and transport the data.

Figure 8:
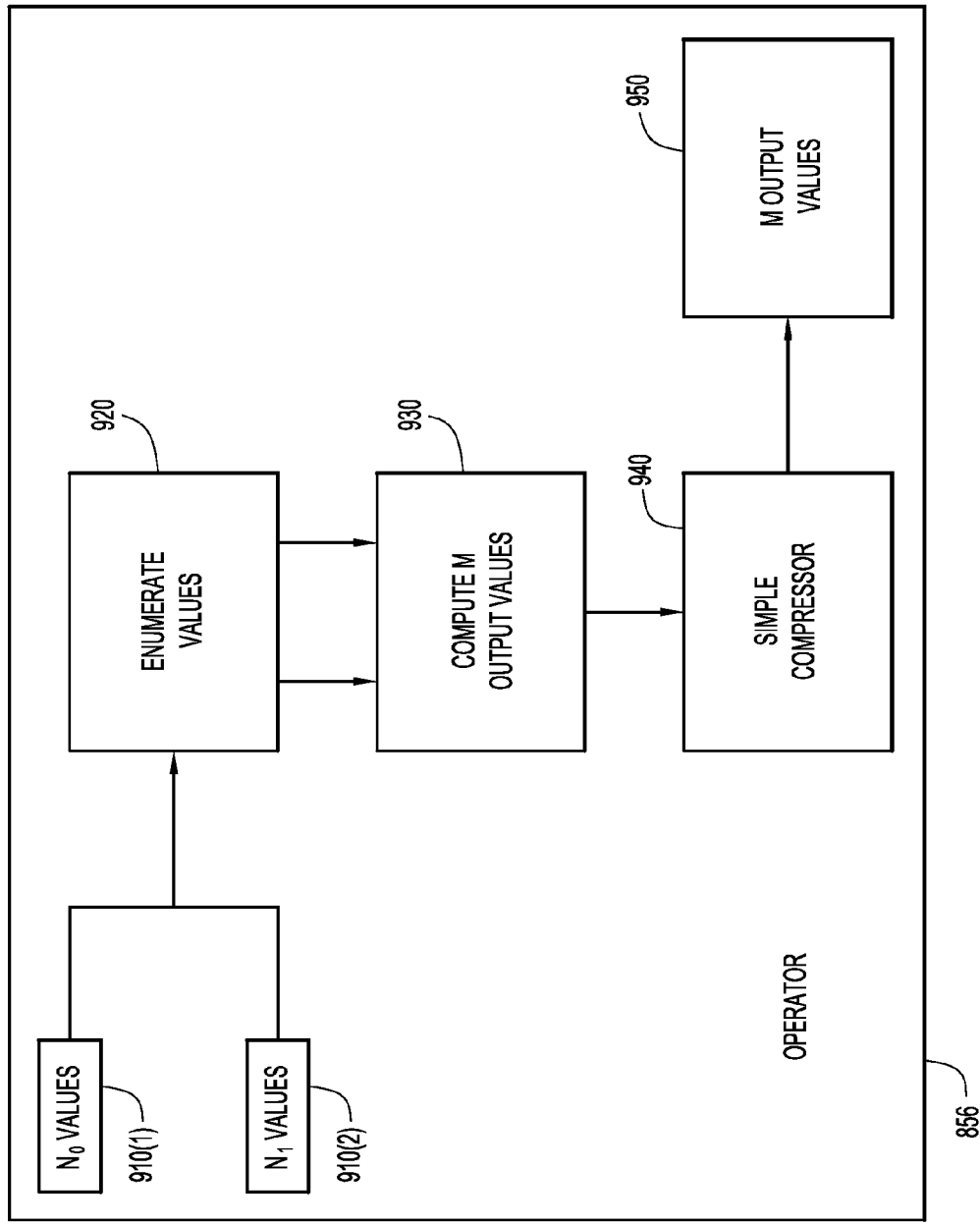
FIG. 8 is another diagrammatic illustration showing an operator in accordance with an embodiment of the present invention.

FIG. 8 shows a more detailed representation of an operator used for query processing in which data is first decompressed, operated upon, and then recompressed. This figure represents a conventional manner of performing computations on compressed data, specifically in that data is decompressed before it is operated upon. While present invention embodiments encompass optimized situations in which data is computed upon while still being in compressed format, in scenarios in which such optimizations to compute on compressed data may not be applicable, data may still be processed in response to query evaluation using the generalized operator structure of FIG. 8.

Inputs $N_0$ values 910(1) and $N_1$ values 910(2) represent inputs into an operator block 856, where $N_0$ and $N_1$ represent a number of values. These inputs include cases in which $N_0$ and $N_1$ are equal to one another as well as cases in which $N_0$ and $N_1$ are not equal to one another. At operation 920, input values still in compressed format are enumerated (or decompressed). At operation 930, computations are performed on the decompressed values, generating M output values in response to the query parameters. At operation 940, the output values are recompressed and provided as output (M output values) at operation 950. Enumeration is meant to indicate that all of the decompressed values may not be produced at once, and in particular, may not ever all be present in uncompressed form at the same time.

Present invention embodiments may utilize computational techniques to achieve greater efficiency in retrieving data that has been hierarchically compressed. Several examples of such techniques are described in additional detail below. Such techniques allow a portion of the compressed data to be subjected to subsequent analysis, rather than performing computations on a larger (or the entire) compressed data set. These computations may be performed at runtime, or alternatively, be stored for subsequent retrieval. Operations disclosed herein allow manipulation of the compression hierarchy to isolate desired data. In general, the computational work performed is proportional to the compressed size of the data.

In certain cases, compression nodes of present invention embodiments may be used to defer or postpone computational work. For example, certain data flow operations such as filtering, repeating and synthesizing a dictionary may be performed using the compression nodes of present invention embodiments.

Figure 9:
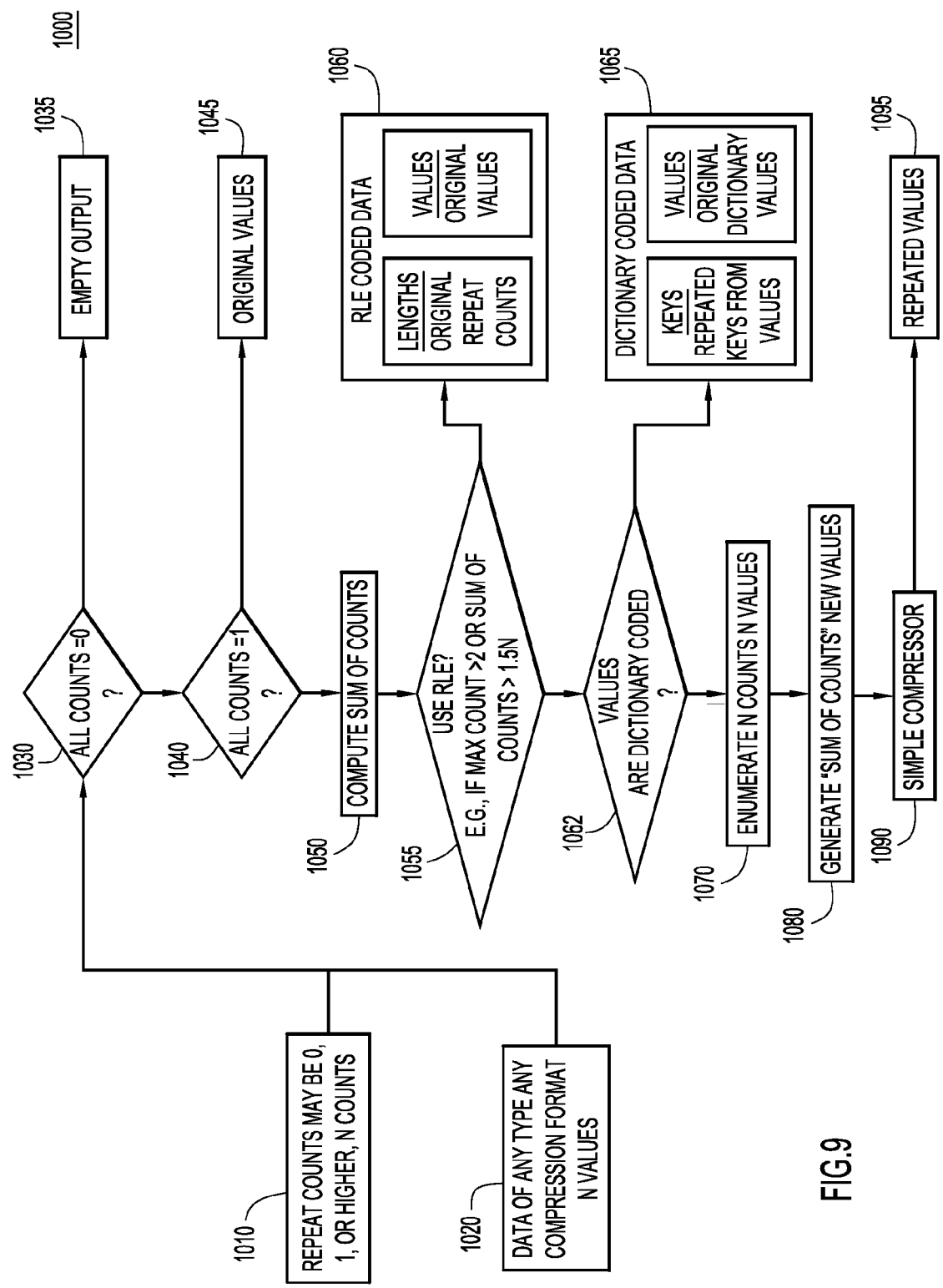
FIG. 9 is a flow diagram of query processing, including several ways of manipulating the compression hierarchy to avoid computation, in accordance with an embodiment of the present invention.

FIG. 9 shows an example of a processing flow, e.g., for query processing, that may reduce or defer computational work according to present invention embodiments. Data from join operations or other similar operations may include data having a form of repeat counts and values, which are provided as inputs into the processing flow. Specifically, inputs to operator 1000 may include: (1) data of any type having any compression format (N data values) at input 1020; and (2) corresponding repeat counts that are 0, 1, or higher (N counts) at input 1010. In cases in which all counts are zero at operation 1030, the output will be empty, and therefore, computation may be terminated and an empty output returned at operation 1035. In cases in which all counts are 1 at operation 1040, the original values will be returned at operation 1045. Both of these cases may be detected with little computation, as compressed repeat counts include minimum and maximum values, and from these, determination of a constant value is trivial. In certain cases, computational work may be performed using a particular compression node as follows.

The operation of summing a sequence of integers, or computing a "sum of counts" at operation 1050, is an important metriciprimitive and is heavily optimized—for each compression type, specialized techniques may be used for summing data based on the corresponding compression type. For example, if a count input is a sequence of numbers, e.g., [1, 2, 1, 1, 2], and the corresponding values are [a, b, c, d, e], then the output is logically the sequence of values [a, b, b, c, d, e, e]. The length of this sequence is 7, which is exactly 1+2+1+1+2, or the sum of [1, 2, 1, 1, 2], also referred to as the "sum of counts". For bitshaved data with N values, base value B, scale factor S, and K bits per value, the sum is (N*B+(sum of the N values of K bits each))*S. If K is 0, this simplifies to return N*B*S. If K is 1, as will often be the case for repeat counts which are all 0 or 1, then the sum of N values of K bits each is a bitvector population count operation, which is supported in hardware. In other embodiments, if the counts are represented as a dictionary, then the sum is computed by constructing a histogram of dictionary keys, then computing the dot product of the histogram with the dictionary itself. In still other embodiments, if the counts are represented as RLE, then the sum is the dot product of the run lengths and the values.

If the sum of counts is very large, then representing the result of a "repeat" operation as anything other than RLE-compressed may be inefficient. In practice, using a threshold of 1.5N seems to work well. Similarly, if the maximum count value is greater than 2, then downstream operations may gain significant efficiency by leaving the data in RLE form. At operation 1055, RLE compression may be selected if Max Count (the maximum value found in the repeat counts input) is greater than 2 or if the Sum of Counts is greater than 1.5N. In this case, the output will be returned in the form of RLE compressed data, as shown at operation 1060, by synthesizing a RLE compression node whose repeat count child is the original repeat count input 1010, and whose values child is the original value input 1020. RLE compression nodes may be useful for performing filtering operations and/or repeating operations as part of data flow operations during query evaluations. Examples of such operations are provided herein.

In the event that RLE is not selected, the data is evaluated to determine whether it is dictionary coded at operation 1062. In this case, if dictionary compression is selected, the output may be returned in the form of dictionary coded data, as shown at operation 1065. The dictionary values are unchanged from the dictionary values present in the input 1020. The dictionary keys are the original dictionary keys present in the input 1020, but repeated according to the repeat counts input 1010. Computation on the dictionary keys may be performed by recursively invoking the repeat operator 1000. Other encoding schemes, e.g., single-child encoding schemes and fixchar encoding schemes, etc. may be optimized as well.

If none of these optimized schemes apply, then the data may be decompressed or enumerated at operation 1070. At operation 1080, the enumerated values and counts are combined to produce a new uncompressed sequence of values representing the correct output of the repeat operation: values with a corresponding count of 0 are elided, values with a corresponding count of 1 are included once, and values with a corresponding count greater than one appear the number of times corresponding to the count. This new sequence of uncompressed values computed at 1080 has length equal to the "sum of counts", computed at 1050. This sequence may be shorter or longer than the original sequence, or have the same length. At operation 1090, this new sequence of values may be recompressed using a fast compression engine, to generate "repeated values", values which are the output of the repeat operator, as output at operation 1095. It is noted that incoming data to this operator and outgoing data from this operator are both in compressed format.

Figure 10:
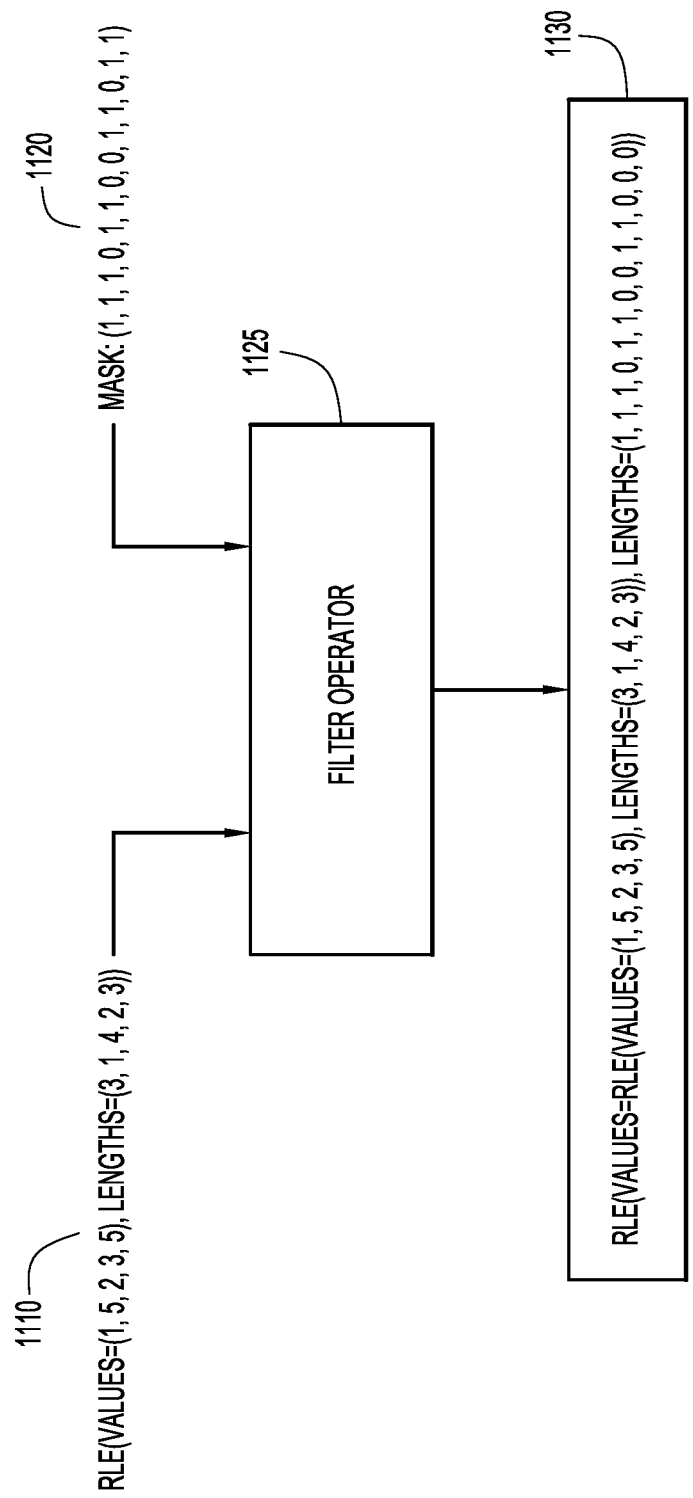
FIG. 10 is an example of manipulating the compression hierarchy, by utilizing a compression node to perform filtering according to an embodiment of the present invention.

Referring to FIG. 10, an example is shown of a filtering technique using a RLE compression node. Filtering allows a subset of data to be isolated for subsequent analysis, thereby reducing computational workload. For example, some data flow operations may effectively apply a bitmask to a datastream, discarding some values deemed not to be of interest. This type of filtering may be performed using the repeat operator illustrated in FIG. 10. In such operations, the repeat count is 0 or 1 (i.e. the bitmask). As an example of the result of using such a filtering technique, a sequence of input values may be masked using a binary operation to isolate data of relevance. Given RLE compressed input data rle(values=(1, 5, 2, 3, 5), lengths=(3, 1, 4, 2, 3)) at flow 1110 and a binary (or Boolean) bitmask at flow 1120, e.g., (1, 1, 1, 0, 1, 1, 0, 0, 1, 1, 0, 1, 1), a filter operator 1125 may be utilized to perform a filtering operation, arriving at the output rle(rle(values=(1, 5, 2, 3, 5), lengths=(3, 1, 4, 2, 3), lengths=(1, 1, 1, 0, 1, 1, 0, 0, 1, 1, 0, 1, 1)), as shown at flow 1130. This corresponds to the output produced at 1060 in FIG. 10. Thus, by utilizing a filter operator, computational load may be deferred. Construction of the new filtering node usually takes a small, constant amount of computational time, while actually decompressing and enumerating values takes an amount of computational time proportional to the number of values. Since the number of values usually includes thousands of values (or more), a significant amount of computational time may be needed to decompress and enumerate values. Moreover, other subsequent operations may cause this entire set of values to be ignored or discarded, e.g., during evaluation of a boolean expression where another branch of the expression is constant "True" or constant "False". In this case, it is desirable to postpone computational work, e.g., the work of nodes 1070, 1080, 1090 in FIG. 9, to compute the filtered result, as this computation need not be performed at all in some cases.

Another computational technique useful for referring or reducing computation load is utilizing RLE compression nodes to perform repeating operations. Some data flow operations, such as join processing, may apply a repeat count to each value. Join processing may perform a lookup operation on each value in an associative array to find 0, 1, or more results for each lookup operation. The output of the lookup operation returns two sets of results: the number of potential results and the value stored in the associative array for each result. The number of potential results indicates how many times each input row needs to be repeated in order to produce the correct set of candidate join results. This repeat operation may be implemented using repeat operator 1225. When the condition 1055 indicates that an RLE compression node is appropriate, the output of the repeat operator is RLE compression data as in 1060, with the repeat input used as the lengths child, and the data input used as the values child.

Figure 11:
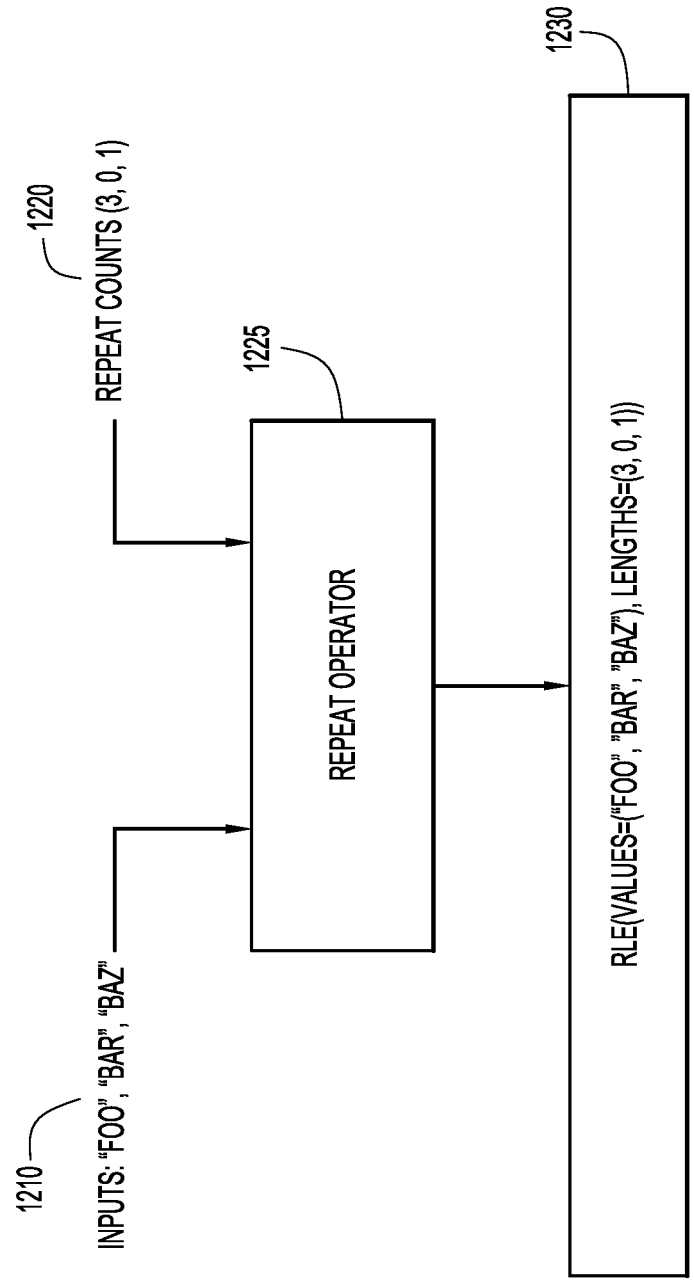
FIG. 11 is an example of manipulating the compression hierarchy, utilizing a compression node to perform a repeat operation according to an embodiment of the present invention.

FIG. 11 provides an example of performing a repeat operation by utilizing a repeat operator 1225. Input values 1210 are provided as "foo", "bar", "baz". During join processing, each of these values "foo", "bar", "baz" are looked up in an associative array to return the number of repeat counts 1220 for each value, e.g., 3, 0, 1. An RLE compression node may be used to perform a repeat operation, aligning the values with their respective repeat counts. Specifically, given values "foo", "bar", "baz" 1210 and repeat counts (3, 0, 1) 1220, an RLE compression node may be utilized to produce an output correlating to each input with its respective count, as shown at flow 1230 as rle(values=("foo", "bar", "baz"), lengths=(3, 0, 1)). From a computational workload perspective, construction of an RLE compression node to perform a repeat operation is almost free. As an alternative, the values resulting from the join operation could first be enumerated, fully repeated, and passed to a compressor, which is an expensive operation, as shown in FIG. 9.

A more-refined version of this optimization may involve cases in which the resulting unit of compressed data could be smaller if the repeat counts were actually applied. For example, consider a filtering operation where the repeat counts are mostly 0. This can occur in a query computation where a predicate is usually false, e.g., a filter "ID=1029375623" where the ID is a unique key. This gives rise to another threshold consideration. If the sum of counts in a repeat operation is significantly smaller than the original count N, then it is computationally more efficient to enumerate the actual values and recompress the result, rather than using a computational trick as disclosed herein, e.g., in FIGS. 10 and 11.

Figure 12:
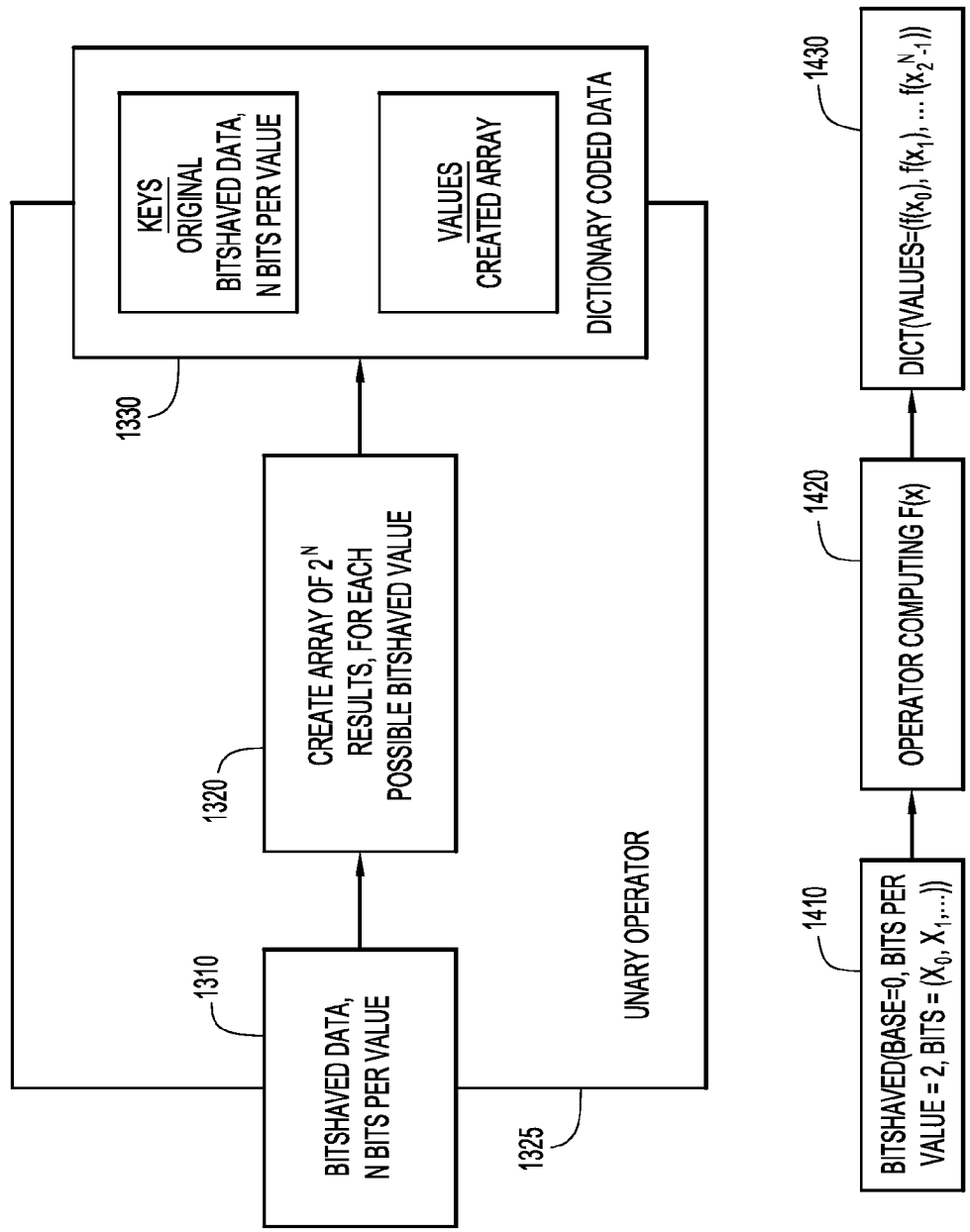
FIG. 12 is an example of a diagrammatic illustration showing a unary operator in accordance with an embodiment of the present invention.

As shown in FIG. 12, another computational technique useful for manipulation of hierarchically compressed data and deferred or reduced computational load is query processing with synthesizing a dictionary. This technique allows computationally expensive calculations to be performed a fewer number of times. For example, if a unary operator 1325 (or binary with one input constant) has data, which is in bitshaved form with a small number N of bits (e.g., a sequence of 4096 values, bitshaved to 2 bits each, or any number less than 12 bits each) as shown at flow 1310, then the result at flow 1330, for each of the 4 possible 2-bit input bit patterns, can be represented by generating a dictionary with $2^N$ entries at 1320, and by using the original data as keys in a new dictionary compression node 1330.

The input unit becomes the "keys" child of a dictionary node. As another example, a similar effect is possible if the inputs to a binary operation are both bitshaved with a small number of bits N and M; corresponding bitshaved values may be combined to produce N+M bit keys into a dictionary with $2^{N+M}$ entries or when combining a dictionary compressed stream with a bitshaved stream. For instance, suppose the input bitshaved values have N bits, and bit pattern '0' represents the value $x_0$, bit pattern '1' represents the value $x_1$, etc. as shown at 1410. Then, the values part of the resulting dictionary compression node at 1430 is $f(x_0)$, $f(x_1)$, etc., when passed through a simple compressor at 1420.

This technique may be applied to any single-input operator, including binary operators in which one input is constant. As in FIG. 10, there is a run-time decision made for each chunk of input, as to whether this technique is efficient to use for computing a result.

Dictionary-based optimization techniques, as disclosed herein, may be utilized to perform computations for each distinct combination, which is significantly less than the total number of values, e.g., string values. A benefit of this approach is that computationally expensive operations are performed a lower number of times. Because the result is maintained in a more compact compressed form, downstream operations will also be able to perform fewer computations.

Refinements for the dictionary scheme include: (a) if the base is non-zero in the bitshaved chunk, a new bitshaved chunk with base equal to 0 will be produced (allowing the values to be used as dictionary keys), (b) if the scale is not 1 in the bitshaved chunk, the scale will be converted to 1 (allowing the bitshaved values to be used as dictionary keys), and (c) if the values in the bitshaved chunk have a range smaller than $2^N$ (this may be determined because a min and a max value are recorded), a smaller number of dictionary values as compared to the total number of dictionary values ($2^N$) will need to be populated.

As an example, suppose the input bitshaved chunk is bitshaved(base=10, bits per value=2, max=2, scale=2, values= (0, 1, 2, 0, 2, 2, 1, 1, 1)). This represents the uncompressed sequence [10, 12, 14, 10, 14, 14, 12, 12, 12]. With this running example, the desired output is the sequence ['status-10', 'status-12', 'status-14', 'status-10', 'status-14', 'status-14', 'status-12', 'status-12', 'status-12']. To produce this output, a dictionary is generated. The basic optimization technique suggests that the dictionary contain the values 'status-10', 'status-12', 'status-14', and 'status-16', corresponding to the four possible values representable in two bits. Based on technique (c), the output value 'status-16' does not need to be computed, nor included in the dictionary, because the actual range of the keys in the input does not include the bit pattern '3', which corresponds to the value '16' and would produce the output 'status-16'. Techniques (a) and (b) have to do with the keys in the output dictionary node. The output of the technique is the compression node dictionary(values=['status-10', 'status-12', 'status-14'], keys=bitshaved(base=0, scale=1, bits per value=2, values=(0, 1, 2, 0, 2, 2, 1, 1, 1)). Note that the values are exactly as in the input bitshaved chunk. By applying (a), the base is 0, and by applying (b) the scale is 1; these are both modified versus the input. Without this modification, dictionary entries with numbers 10, 12, and 14 would be selected, which do not exist.

Figure 13:
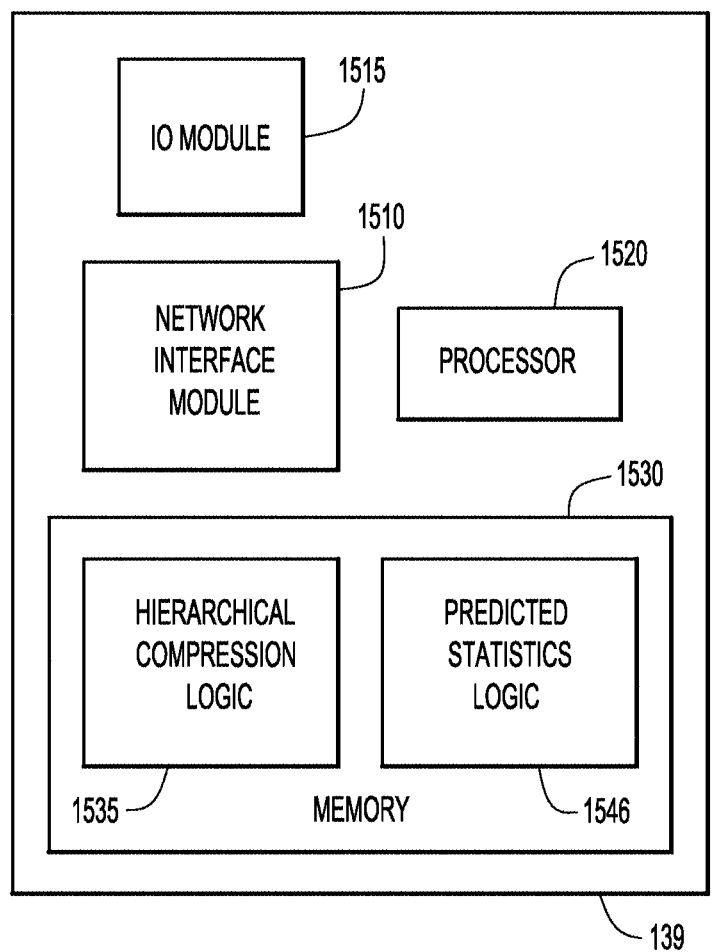
FIG. 13 is a block diagram of an apparatus for generating hierarchically compressed data and manipulating the compression hierarchy to defer or reduce computation in accordance with an embodiment of the present invention.

FIG. 13 illustrates an example block diagram of a system 139, configured to perform the techniques presented herein. System 139 may include a network interface unit 1510, a processor 1520, and a memory 1530. The network interface unit 1510 is configured to receive and send data over a network. I/O module 1515 is configured to send and receive compressed data and to communicate with storage modules 170.

The processor 1520 may be embodied by one or more microprocessors or microcontrollers, and executes software instructions stored in memory 1530 for hierarchical compression and computational deferral at 1535 and at predicted statistics logic 1546, as shown in FIGS. 1-12.

It is noted that blades/nodes 139 (of backend system 138) and front end system 105 may be implemented by any conventional or other computer systems preferably equipped with a display or monitor, a base (e.g., including at least one processor 1520, one or more memories 1530 and/or internal or external network interfaces or communications devices 1510 (e.g., modem, network cards, etc.)), optional input devices (e.g., a keyboard, mouse or other input device), and any commercially available and custom software (e.g., server/communications software, browser/interface software, compression and other modules, etc.).

The hierarchical compression and recursion comparison logic and predicted statistics logic may include one or more modules or units to perform the various functions of present invention embodiments described above. The various modules (e.g., hierarchical compression and recursion compression logic 1535, predicted compression statistics logic 1546, etc.) may be implemented by any combination of any quantity of software and/or hardware modules or units, and may reside within memory 1530 of the back end system for execution by processor 1520.

It will be appreciated that the embodiments described above and illustrated in the drawings represent only a few of the many ways of implementing embodiments for hierarchical data compression.

The environment of the present invention embodiments may include any number of computer or other processing systems (e.g., client or end-user systems, server systems, etc.) and databases or other repositories arranged in any desired fashion, where the present invention embodiments may be applied to any desired type of computing environment (e.g., cloud computing, client-server, network computing, mainframe, stand-alone systems, etc.). The computer or other processing systems employed by the present invention embodiments may be implemented by any number of any personal or other type of computer or processing system (e.g., desktop, laptop, PDA, mobile devices, etc.), and may include any commercially available operating system and any combination of commercially available and custom software (e.g., browser software, communications software, server software, etc.). These systems may include any types of monitors and input devices (e.g., keyboard, mouse, voice recognition, etc.) to enter and/or view information.

It is to be understood that the software (e.g., software for hierarchical compression and recursion compression logic 1535, predicted compression statistics logic 1546, etc.) of the present invention embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present invention embodiments may alternatively be implemented by any type of hardware and/or other processing circuitry. The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, Intranet, Internet, hardwire, modem connection, wireless, etc.). For example, the functions of the present invention embodiments may be distributed in any manner among the various end-user/client and server systems, and/or any other intermediary processing devices. The software and/or algorithms described above and illustrated in the flow charts may be modified in any manner that accomplishes the functions described herein. In addition, the functions in the flow charts or description may be performed in any order that accomplishes a desired operation.

The software of the present invention embodiments (e.g., hierarchical compression and recursion compression logic 1535, predicted compression statistics logic 1546, etc.) may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, WAN, Internet, Intranet, VPN, etc.). The computer or other processing systems of the present invention embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, Intranet, etc.).

The system may employ any number of any conventional or other databases, data stores or storage structures (e.g., files, databases, data structures, data or other repositories, etc.) to store information (e.g., predicted compression statistics, compressed data, etc.). The database system may be implemented by any number of any conventional or other databases, data stores or storage structures (e.g., files, databases, data structures, data or other repositories, etc.) to store information (e.g., predicted compression statistics, compressed data, etc.). The database system may be included within or coupled to the server and/or client systems. The database systems and/or storage structures may be remote from or local to the computer or other processing systems, and may store any desired data (e.g., predicted compression statistics, compressed data, etc.).

The present invention embodiments may employ any number of any type of user interface (e.g., Graphical User Interface (GUI), command-line, prompt, etc.) for obtaining or providing information (e.g., predicted compression statistics, compressed data, etc.), where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A system for hierarchically compressing data comprising:
one or more processors configured to:
create a compression hierarchy of compression nodes, wherein each compression node is associated with a compression operation to produce compressed data, and wherein creating a compression hierarchy comprises:
creating a dictionary compression node in the compression hierarchy of compression nodes;
determine a path of one or more compression nodes through said compression hierarchy, based upon compression statistics, to compress data; and
compress the data by the compression nodes of the path, wherein compressing the data comprises:
performing a computation on the data using the dictionary compression node, wherein the computation is performed by applying bitshaved data to the dictionary compression node to generate a dictionary having values and keys; and
performing the computation for each generated value.

2. The system of claim 1, wherein the one or more processors are configured to select a path of the compression hierarchy having a measure of compression higher than any of the other paths.

3. The system of claim 1, wherein the compression nodes are configured to compress one or more data types selected from a group consisting of: integer, character and double.

4. The system of claim 1, wherein each compression node is selected from a group consisting of: a bitshaved compression node, a dictionary compression node, a run length encoding compression node, a character-based compression node and a delta compression node.

5. The system of claim 1, wherein the one or more processors are configured to:
create a run length encoded compression node in the compression hierarchy of compression nodes; and
perform a filtering operation on the data using the run length encoded compression node, wherein the filtering operation is performed in part by applying a bitmask to a values field of the run length encoded compression node.

6. The system of claim 1, wherein the one or more processors are configured to:
create a run length encoded compression node in the compression hierarchy of compression nodes; and perform part of a join operation on the data using the run length encoded compression node, wherein the join operation is performed by applying input data to a values field of the run length encoded compression node and by applying repeat counts to a lengths field of the run length encoded compression node.

7. A computer program product for hierarchically compressing data comprising a computer readable storage medium having computer readable program code embodied therewith, the computer readable program code, when executed by a processor, causes the processor to:
create a compression hierarchy of compression nodes, wherein each compression node is associated with a compression operation to produce compressed data, and wherein creating a compression hierarchy comprises:
creating a dictionary compression node in the compression hierarchy of compression nodes;
determine a path of one or more compression nodes through said compression hierarchy, based upon compression statistics, to compress data; and
compress the data by the compression nodes of the path, wherein compressing the data comprises:
performing a computation on the data using the dictionary compression node, wherein the computation is performed by applying bitshaved data to the dictionary compression node to generate a dictionary having values and keys; and
performing the computation for each generated value.

8. The computer program product of claim 7, wherein the computer readable program code is configured to cause the processor to select a path of the compression hierarchy having a measure of compression higher than any of the other paths.

9. The computer program product of claim 7, wherein each compression node is selected from a group consisting of: a bitshaved compression node, a dictionary compression node, a run length encoding compression node, a character-based compression node and a delta compression node.

10. The computer program product of claim 7, wherein the computer readable program code is configured to cause the processor to:
create a run length encoded compression node in the compression hierarchy of compression nodes; and
perform a filtering operation on the data using the run length encoded compression node, wherein the filtering operation is performed in part by applying a bitmask to a values field of the run length encoded compression node.

11. The computer program product of claim 7, wherein the computer readable program code is configured to cause the processor to:
create a run length encoded compression node in the compression hierarchy of compression nodes; and
perform part of a join operation on the data using the run length encoded compression node, wherein the join operation is performed by applying input data to a values field of the run length encoded compression node and by applying repeat counts to a lengths field of the run length encoded compression node.

* * * * *